United States Patent
Mawatari

(10) Patent No.: US 10,369,787 B2
(45) Date of Patent: Aug. 6, 2019

(54) PIEZOELECTRIC THIN FILM, PIEZOELECTRIC ACTUATOR, INKJET HEAD, INKJET PRINTER, AND METHOD FOR MANUFACTURING PIEZOELECTRIC ACTUATOR

(71) Applicant: KONICA MINOLTA, INC., Chiyoda-ku, Tokyo (JP)

(72) Inventor: Kenji Mawatari, Musashino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/575,644

(22) PCT Filed: May 11, 2016

(86) PCT No.: PCT/JP2016/064044
§ 371 (c)(1),
(2) Date: Nov. 20, 2017

(87) PCT Pub. No.: WO2016/190110
PCT Pub. Date: Dec. 1, 2016

(65) Prior Publication Data
US 2018/0170044 A1 Jun. 21, 2018

(30) Foreign Application Priority Data
May 25, 2015 (JP) .................. 2015-105621

(51) Int. Cl.
*H01L 41/187* (2006.01)
*B41J 2/14* (2006.01)
(Continued)

(52) U.S. Cl.
CPC . *B41J 2/14* (2013.01); *B41J 2/16* (2013.01); *C04B 35/491* (2013.01); *C23C 14/08* (2013.01);
(Continued)

(58) Field of Classification Search
CPC .. B41J 2/14; B41J 2/16; C04B 35/491; C23C 14/08; H01L 41/09; H01L 41/187; H01L 41/316; H01L 41/319
(Continued)

(56) References Cited

U.S. PATENT DOCUMENTS 5,886,717 A * 3/1999 Satake .................. B41J 2/14233
347/70
2005/0168916 A1 * 8/2005 Dougherty ............. C07F 7/006
361/321.1
(Continued)

FOREIGN PATENT DOCUMENTS

JP H06290983 A 10/1994
JP 2008270704 A 11/2008
(Continued)

OTHER PUBLICATIONS

Extended European Search Report corresponding to Application No. 16799818.6-1212/3306687 PCT/JP2016064044; dated Apr. 26, 2018.
(Continued)

*Primary Examiner* — Thomas M Dougherty
(74) *Attorney, Agent, or Firm* — Cantor Colburn LLP

(57) ABSTRACT

A piezoelectric thin film is formed by adding a donor element to lead zirconate titanate. In the piezoelectric thin film, a molar ratio of lead to a total sum of zirconium and titanium is 105% or higher, and, when positive and negative coercive electric fields in polarization and electric field hysteresis are referred to as Ec (+) and Ec (−), respectively, a value of |Ec (+) |/|Ec (−) | is 0.5 or more and 1.5 or less.

19 Claims, 9 Drawing Sheets

(51) Int. Cl.
*B41J 2/16* (2006.01)
*C04B 35/491* (2006.01)
*C23C 14/08* (2006.01)
*H01L 41/09* (2006.01)
*H01L 41/316* (2013.01)
*H01L 41/319* (2013.01)

(52) U.S. Cl.
CPC ............ *H01L 41/09* (2013.01); *H01L 41/187* (2013.01); *H01L 41/316* (2013.01); *H01L 41/319* (2013.01)

(58) Field of Classification Search
USPC .......................................................... 310/358
See application file for complete search history.

(56) References Cited

U.S. PATENT DOCUMENTS

| | | | |
|---|---|---|---|
| 2008/0231667 A1 | 9/2008 | Arakawa | |
| 2010/0194824 A1 | 8/2010 | Arakawa et al. | |
| 2011/0012963 A1* | 1/2011 | Miyazawa | B41J 2/055 347/71 |
| 2011/0169898 A1* | 7/2011 | Kato | B41J 2/14233 347/71 |
| 2011/0204750 A1 | 8/2011 | Fujii et al. | |
| 2012/0104309 A1* | 5/2012 | Koizumi | B82Y 30/00 252/62.9 PZ |
| 2013/0250011 A1* | 9/2013 | Sakai | B41J 2/14233 347/71 |
| 2015/0085023 A1* | 3/2015 | Sakai | H01L 41/053 347/70 |
| 2015/0194591 A1 | 7/2015 | Fujii | |
| 2015/0311426 A1* | 10/2015 | Tseng | H01L 41/331 427/532 |
| 2016/0043663 A1* | 2/2016 | Katsumura | H02N 2/188 310/339 |
| 2017/0001912 A1* | 1/2017 | Doi | C01G 25/006 |
| 2017/0114473 A1* | 4/2017 | Chen | C30B 1/023 |

FOREIGN PATENT DOCUMENTS

| | | |
|---|---|---|
| JP | 2010087144 A | 4/2010 |
| JP | 2011078203 A | 4/2011 |
| JP | 2013229510 A | 11/2013 |
| JP | 2014060330 A | 4/2014 |
| JP | 2014172778 A | 9/2014 |
| WO | 2014024696 A1 | 2/2014 |

OTHER PUBLICATIONS

International Search Report for corresponding Application No. PCT/JP2016/064044; dated Aug. 2, 2016.
Takamichi Fujii et al., "Characterization of Nb-doped Pb(Zr,Ti)O3 films deposited on stainless steel and silicon substrates by RFmagnetron sputtering for MEMS applications," Sensors and Actuators A: Physical. pp. 220-225, 2010.
Written Opinion of the International Searching Authority for corresponding Application No. PCT/JP2016/064044; dated Aug. 2, 2016.

* cited by examiner

CROSS-SECTIONAL SEM IMAGE OF PLZT FILM (EXAMPLE 1)

CROSS-SECTIONAL SEM IMAGE OF PLZT FILM
(COMPARATIVE EXAMPLE 1)

PIEZOELECTRIC THIN FILM, PIEZOELECTRIC ACTUATOR, INKJET HEAD, INKJET PRINTER, AND METHOD FOR MANUFACTURING PIEZOELECTRIC ACTUATOR

CROSS REFERENCE TO RELATED APPLICATIONS

This is the U.S. national stage of application No. PCT/JP2016/064044, filed on May 11, 2016. Priority under 35 U.S.C. § 119(a) and 35 U.S.C. § 365(b) is claimed from Japanese Application No. 2015-105621, filed May 25, 2015, the disclosure of which is incorporated herein by reference.

TECHNICAL FIELD

The present invention relates to a piezoelectric thin film obtained by adding a donor element to lead zirconate titanate, a piezoelectric actuator including the piezoelectric thin film, an inkjet head, an inkjet printer, and a method for manufacturing the piezoelectric actuator.

BACKGROUND ART

Conventionally, as an electromechanical transducer such as a driving element and a sensor, a piezoelectric body such as lead zirconate titanate (PZT) is used. Also, in recent years, to meet a demand for a small-sized, high-density, and low-cost apparatus, a micro electro mechanical systems (MEMS) element using a silicon (Si) substrate is increasingly used. To apply the piezoelectric body to the MEMS element, the piezoelectric body is desirably in the form of a thin film. By forming the piezoelectric body in a thin-film shape, high-precision processing using semiconductor process techniques such as film formation and photolithography is available, which enables size reduction and high density to be achieved. Also, since elements can be processed collectively on a large-area wafer, cost can be reduced. Further, electromechanical transduction efficiency is improved, which brings about advantages such as improvement in property of the driving element and improvement in sensitivity of the sensor.

As an application example of such a device using the MEMS element is applied, an inkjet printer is known. In the inkjet printer, ejection of ink is controlled while an inkjet head having a plurality of channels ejecting liquid ink is moved relatively to a recording medium such as a sheet and a cloth to cause a two-dimensional image to be formed on the recording medium.

Ejection of ink can be performed by using a pressure-type actuator (a piezoelectric type, an electrostatic type, thermal deformation, or the like) or by generating bubbles in the ink in the tube by means of heat. Among others, the piezoelectric-type actuator is advantageous in that the output force is large, the modulation is available, the response is fast, any kind of ink can be used, and the like, and is often used in recent years. In particular, to achieve a high-resolution (merely requiring a small droplet), small-sized, and low-cost printer, utilization of an inkjet head using a thin-film piezoelectric body is appropriate.

Further, in recent years, the inkjet printer is required to form a high-resolution image at higher speed. To do so, the inkjet head is required to have performance of ejecting high-viscosity ink of 10 cp (0.01 Pa·s) or higher. To achieve ejection of the high-viscosity ink, the piezoelectric thin film (ferroelectric thin film) is required to have a high piezoelectric property (piezoelectric constant $d_{31}$) and a displacement generation force (film thickness of 1 µm or longer).

On the other hand, as a method for forming a piezoelectric body such as PZT on a substrate such as an Si substrate, a chemical film forming method such as chemical vapor deposition (CVD), a physical method such as sputtering and ion plating, and a liquid phase growth method such as a sol-gel method are known. The upper limit of the thickness of the thin film obtained by these methods is approximately 10 µm. When the film thickness is longer than the limit, a crack and exfoliation will be generated, and a desired property cannot be obtained.

The formed PZT exhibits an excellent piezoelectric effect when the crystal has a perovskite structure illustrated in FIG. 11. The perovskite structure is an $ABO_3$-type crystal structure ideally having a cubic unit cell and including metal A (for example, lead) arranged at each corner of the cubic crystal, metal B (for example, zirconium or titanium) arranged at the center of the body of the cubic crystal, and oxygen O arranged at the center of each face of the cubic crystal. The perovskite-structured crystal shall include a tetragonal crystal, an orthorhombic crystal, a rhombohedral crystal, and the like into which the cubic crystal is distorted.

The PZT thin film formed on the electrode on the Si substrate is a polycrystal, which is a collective body of a plurality of crystals, due to a difference of a lattice constant from that of the crystal of the electrode. The polycrystal is formed by collecting granular crystals (granular crystals) each having a grain diameter of hundreds of nanometers or by collecting columnar crystals, each of which is a single elongated crystal grain having a width of hundreds of nanometers and extending in the film thickness direction. As for the columnar crystal, it is known that, the larger the number of crystals which have grown with the same crystal face in the film thickness direction is (the higher the degree of orientation is), the higher the piezoelectric property of the film becomes.

One of methods for improving the piezoelectric property is to add an impurity to a piezoelectric body to facilitate occurring of non-180° polarization rotation so as to improve the relative dielectric constant and the piezoelectric property. In particular, it is known that the piezoelectric body having the perovskite structure of the $ABO_3$ type illustrated in FIG. 11 can have a high relative dielectric constant and a high piezoelectric property by adding as a donor element an element having a valence higher by one than an element located at site A or site B.

For example, in a PZT bulk ceramic, known as a donor element to be added to site A is a lanthanoid element such as lanthanum (La), bismuth (Bi), or the like, which is a trivalent cation having a valence higher by one than lead (Pb), which is a divalent ion. Also, known as a donor element to be added to site B of the PZT is niobium (Nb), tantalum (Ta), or the like, which is a pentavalent ion having a valence higher by one than each of titanium (Ti) and zirconium (Zr), which is a quadrivalent ion.

It is known that the piezoelectric property is improved when the above donor element is added to a thin-film piezoelectric body (piezoelectric thin film) instead of the bulk ceramic. For example, Non Patent Literature 1 describes that, by adding Nb to a PZT piezoelectric thin film, piezoelectric constant $d_{31}$ of 250 [pm/V] or higher in terms of an absolute value is obtained.

Meanwhile, the donor additive has a higher ion valence than each of the original elements of the PZT constituting a crystal. Hence, when the additive amount increases, the ion balance is lost, and the amount of positive electric charge is likely to increase. As a result, it is known that an internal electric field caused by maldistribution of the positive electric charge is generated in the crystal.

In general, in a piezoelectric thin film with no or a small amount of donor additive, polarization and electric field hysteresis representing the relationship between the polarization amount (P) and the electric field (E) (hereinbelow referred to as P-E hysteresis) is in a symmetric shape across the vertical axis (E=0V), that is, a shape in which the polarization amounts (absolute values) on the positive and negative electric field sides are approximately symmetric, as in Patent Literature 1. However, in a piezoelectric thin film with a large amount of donor additive, it is known that the P-E hysteresis is shifted to the positive electric field side and is in a shape in which the polarization amounts (absolute values) on the positive and negative electric field sides are asymmetric. In the P-E hysteresis, an electric field when the polarization amount is zero is called a coercive electric field. In a case in which the P-E hysteresis is in a symmetric shape, the positive and negative coercive electric fields (referred to as Ec (+) and Ec (−)) are equal values. In a case in which the P-E hysteresis is shifted to the positive side, the values of the positive and negative coercive electric fields are also shifted to the positive side, and the ratio between the positive and negative coercive electric fields (Ec (+)/Ec (−)) thus increases.

Meanwhile, in an example in Patent Literature 1, a piezoelectric thin film formed on lead lanthanum titanate (PLT) serving as a seed layer seems to be La-doped PZT, but it is clearly stated that the La additive amount is zero. Accordingly, it is likely that the symmetric P-E hysteresis as illustrated in Patent Literature 1 is for PZT with no donor additive.

In a case in which a piezoelectric thin film having asymmetric P-E hysteresis is used and interposed between upper and lower electrodes to form a piezoelectric element, and in which the lower electrode is used as a common electrode while the upper electrode is used as an individual electrode, asymmetry of piezoelectric displacement due to the pole of driving voltage to be applied to the individual electrode occurs, and a high piezoelectric property can be obtained only when the driving voltage is negative (only with negative bias driving). This respect is similarly described in Patent Literature 2. That is, Patent Literature 2 describes that, when the P-E hysteresis is shifted to the positive electric field side, polarization is hard to occur even when a positive electric field is applied because the coercive electric field Ec (+) is high, the piezoelectric constant $d_{31}$ (+) when a positive electric field is applied tends to be lower than the piezoelectric constant $d_{31}$ (−) when a negative electric field is applied, and the piezoelectric property is thus hard to be obtained in application of the positive electric field and easy to be obtained in application of the negative electric field.

Also, for example, in Patent Literature 3, a piezoelectric actuator is driven at voltage between positive driving voltage (for example, 5V) and negative driving voltage (for example, −26V) in a range in which one of positive and negative coercive electric fields in asymmetric P-E hysteresis whose absolute value is higher is not exceeded, that is, the piezoelectric actuator is driven at lower voltage (for example, 26V in terms of an absolute value) than driving voltage required when the piezoelectric actuator is driven by a normal driving method (for example, 31V in terms of an absolute value), to attempt to reduce load to the piezoelectric body and improve driving durability and element reliability of the piezoelectric actuator.

CITATION LIST

Patent Literature

Patent Literature 1: JP 6-290983 A (refer to paragraphs [0023] and [0026], FIG. 5, and the like)
Patent Literature 2: JP 2010-87144 A (refer to paragraphs [0034] to [0036] and the like)
Patent Literature 3: JP 2011-78203 A (refer to claim 1, paragraphs [0027] and [0037] to [0040], FIG. 1B, and the like)
Non Patent Literature
Non Patent Literature 1: Takamichi Fujii et al, "Characterization of Nb-doped Pb(Zr,Ti)O3 films deposited on stainless steel and silicon substrates by RF-magnetron sputtering for MEMS applications", Sensors and Actuators A: Physical, Volume 163, Issue 1, September 2010, Pages 220-225

SUMMARY OF INVENTION

Technical Problem

Meanwhile, in the piezoelectric thin film, oxygen vacancies are distributed in a region with low crystallinity around the interface with the lower electrode. Since an oxygen ion is electrically negative, the region with the oxygen vacancy generated by disappearance of oxygen ions is electrically positive. Accordingly, as in Patent Literature 3, when an element is continuously driven with negative bias, the aforementioned oxygen vacancies distributed on the lower electrode side of the piezoelectric thin film are drawn and diffused to the upper electrode side to which negative bias is applied. This causes breakdown of the piezoelectric thin film and a decrease in piezoelectric displacement due to the breakdown, which leads to a problem in which reliability of the piezoelectric thin film is lowered.

To prevent such lowering of reliability from occurring, the element needs to be driven with positive bias to restrict diffusion of the oxygen vacancies. However, as described above, in a case in which the P-E hysteresis is shifted to the positive electric field side, a high piezoelectric property is hard to be obtained when the element is driven with positive bias. For this reason, desired is a piezoelectric thin film in which asymmetry of the P-E hysteresis is alleviated to enable driving with positive bias.

In this respect, in Patent Literature 2 described above, the amount of lead in the film is set to 1.03 or less to attempt to decrease the amount of excessive lead ions in the film, eliminate asymmetry of the P-E hysteresis, and obtain a high piezoelectric property (piezoelectric constant $d_{31}$ (+)) even with positive bias. However, in this method, along with the decrease of the amount of the lead ions, the amount of oxygen ions also decreases to maintain charge neutral, and the oxygen vacancies in the film increase. The oxygen vacancies easily move inside the crystal of the piezoelectric thin film at the time of application of heat or an electric field. This causes a new problem in which, even in a case in which the film property at a first stage of film formation is favorable, the property is degraded after processing the piezoelectric element, and displacement is lowered after long-time driving. Also, in a case in which the excessive amount of lead is small, crystallinity of the piezoelectric thin film is lowered especially at the first stage of film formation, that is, on the interface side with the lower electrode, which easily causes film exfoliation. Accordingly, the method in which the amount of lead is set to 1.03 or less cannot solve a problem in terms of reliability of the film such as a temporal change of the piezoelectric property and film exfoliation.

The present invention is accomplished to solve the above problem, and an object of the present invention is to provide a piezoelectric thin film enabling asymmetry of P-E hysteresis to be alleviated, enabling a high piezoelectric property to be achieved even with positive bias driving, reducing a temporal change of the piezoelectric property and film exfoliation as well as breakdown, and enabling reliability of a film to be improved, a piezoelectric actuator including the piezoelectric thin film, an inkjet head, an inkjet printer, and a method for manufacturing the piezoelectric actuator.

Solution to Problem

A piezoelectric thin film according to one aspect of the present invention is a piezoelectric thin film obtained by adding a donor element to lead zirconate titanate, wherein a molar ratio of lead to a total sum of zirconium and titanium is 105% or higher, and when positive and negative coercive electric fields in polarization and electric field hysteresis are referred to as Ec (+) and Ec (−), respectively, a value of |Ec (+) |/|Ec (−) | is 0.5 or more and 1.5 or less.

Advantageous Effects of Invention

According to the above configuration, it is possible to alleviate asymmetry of P-E hysteresis and achieve a high piezoelectric property even with positive bias driving. Also, a temporal change of the piezoelectric property and film exfoliation as well as breakdown can be reduced, and reliability of a film can be improved.

DESCRIPTION OF EMBODIMENTS

Description of an embodiment of the present invention with reference to the drawings will be provided in the following manner. It is to be noted that, in the present description, in a case in which a numerical range is expressed as A to B, the values of the lower limit A and the upper limit B shall be included in the numerical range.

[Configuration of Inkjet Printer]

Figure 1:
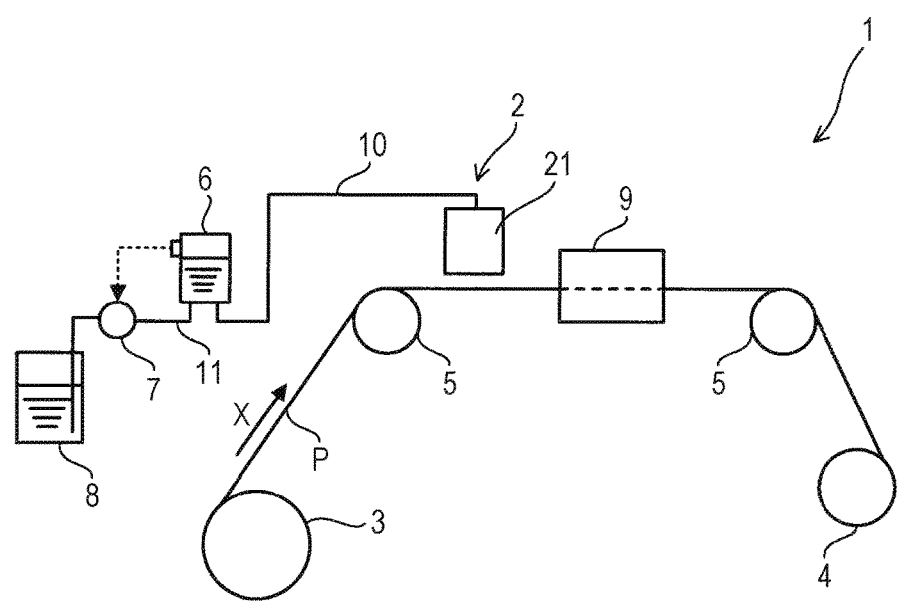
FIG. 1 illustrates a schematic configuration of an inkjet printer according to an embodiment of the present invention.

FIG. 1 illustrates a schematic configuration of an inkjet printer 1 according to the present embodiment. The inkjet printer 1 is a so-called line-head-type inkjet recording apparatus in which inkjet heads 21 are provided in a line form in a width direction of a recording medium in an inkjet head unit 2.

The inkjet printer 1 includes the aforementioned inkjet head unit 2, a feed-out roll 3, a wind-up roll 4, two back rolls 5 and 5, a middle tank 6, a liquid feed pump 7, a reserving tank 8, and a fixing mechanism 9.

The inkjet head unit 2 lets the inkjet head 21 eject ink toward a recording medium P to perform image formation (drawing) based on image data and is arranged near one back roll 5. The inkjet head 21 will be described in detail below.

Each of the feed-out roll 3, the wind-up roll 4, and the respective back rolls 5 is a columnar member rotatable around an axis. The feed-out roll 3 is a roll feeding out the elongated recording medium P wound over a circumferential surface thereof in layers toward a position opposed to the inkjet head unit 2. The feed-out roll 3 is rotated by a not-illustrated driving means such as a motor to feed out and transfer the recording medium P in an X direction in FIG. 1.

The wind-up roll 4 winds up over a circumferential surface thereof the recording medium P fed out from the feed-out roll 3 and having ink ejected thereon by the inkjet head unit 2.

The respective back rolls 5 are arranged between the feed-out roll 3 and the wind-up roll 4. One back roll 5 located on an upstream side in a transfer direction of the recording medium P transfers the recording medium P fed out by the feed-out roll 3 toward the position opposed to the inkjet head unit 2 while winding and supporting the recording medium P over a part of a circumferential surface thereof. The other back roll 5 transfers the recording medium P from the position opposed to the inkjet head unit 2 toward the wind-up roll 4 while winding and supporting the recording medium P over a part of a circumferential surface thereof.

The middle tank 6 temporarily reserves ink supplied from the reserving tank 8. The middle tank 6 is also connected to a plurality of ink tubes 10, adjusts back pressure of ink in each of the inkjet heads 21, and supplies ink to each of the inkjet heads 21.

The liquid feed pump 7 is adapted to supply ink reserved in the reserving tank 8 to the middle tank 6 and is arranged in the middle of a supply tube 11. Ink reserved in the reserving tank 8 is pumped up by the liquid feed pump 7 and is supplied to the middle tank 6 via the supply tube 11.

The fixing mechanism 9 fixes to the recording medium P ink ejected on the recording medium P by the inkjet head unit 2. The fixing mechanism 9 is constituted by a heater adapted to heat and fix the ejected ink to the recording medium P, a UV lamp adapted to irradiate the ejected ink with UV (ultraviolet light) to cure the ink, or the like.

In the above configuration, the recording medium P fed out from the feed-out roll 3 is transferred by the back roll 5 to the position opposed to the inkjet head unit 2, and ink is ejected from the inkjet head unit 2 to the recording medium P. Thereafter, the ink ejected to the recording medium P is fixed by the fixing mechanism 9, and the recording medium P to which the ink has been fixed is wound up by the wind-up roll 4. In this manner, in the line-head-type inkjet printer 1, ink is ejected while the recording medium P is being transferred in a state in which the inkjet head unit 2 stands still, and an image is formed on the recording medium P.

It is to be noted that the inkjet printer 1 may be configured to form an image on the recording medium in a serial head method. The serial head method is a method in which, while the recording medium is being transferred, the inkjet head is moved in a direction perpendicular to the transfer direction to eject ink, and an image is formed. In this case, the inkjet head moves in the width direction of the recording medium in a state of being supported on a structure body such as a carriage. Also, as the recording medium, a sheet-like recording medium cut in a predetermined size (shape) in advance may be used, instead of the elongated recording medium.

[Configuration of Inkjet Head]

Figure 2A:
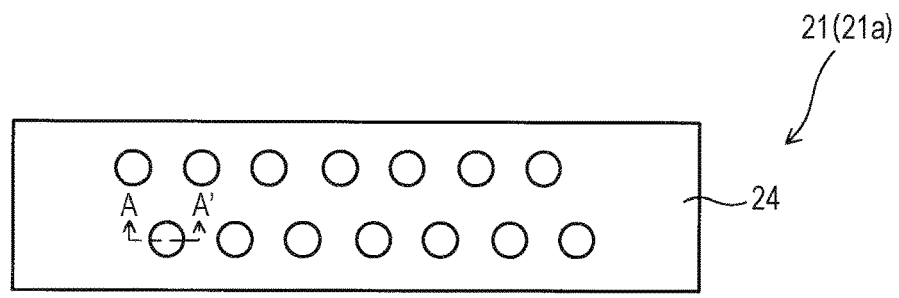
FIG. 2A is a plan view illustrating a schematic configuration of an actuator of an inkjet head included in the inkjet printer.
Figure 2B:
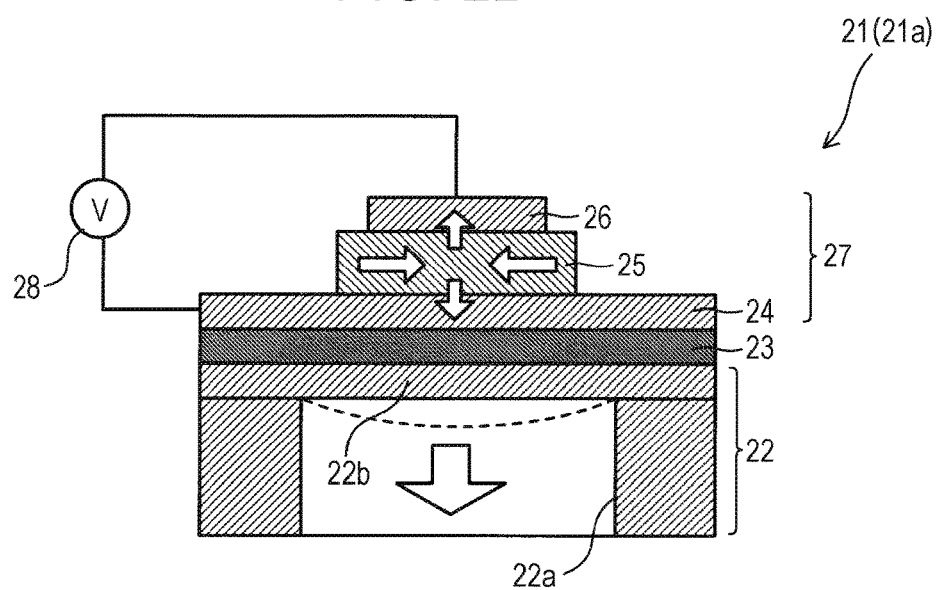
FIG. 2B is a cross-sectional view taken along arrow A-A' of the plan view in FIG. 2A.
Figure 3:
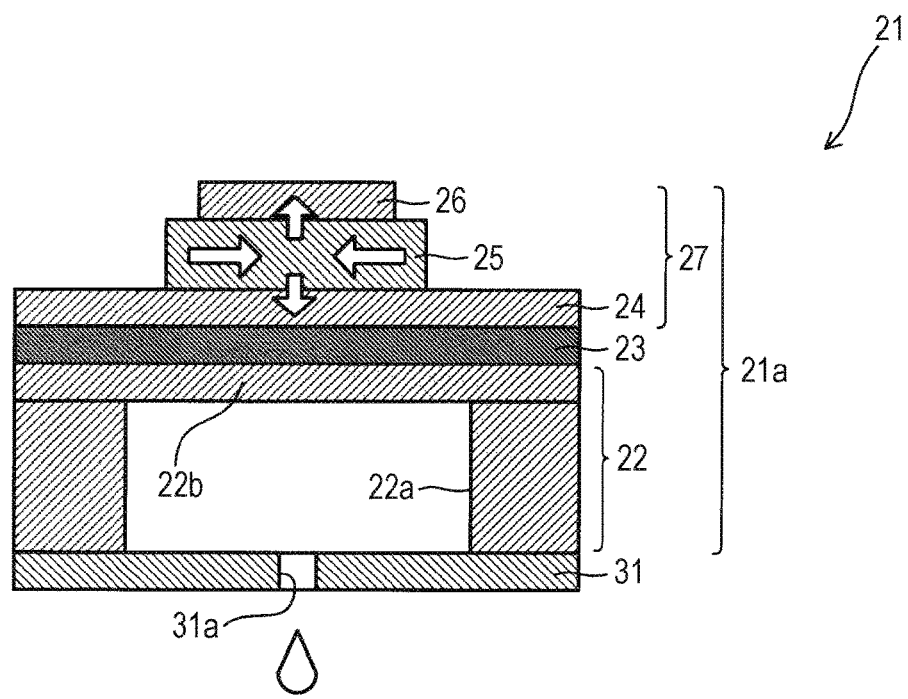
FIG. 3 is a cross-sectional view of the inkjet head.

Next, a configuration of the aforementioned inkjet head 21 will be described. FIG. 2A is a plan view illustrating a schematic configuration of a piezoelectric actuator 21*a* of the inkjet head 21, and FIG. 2B is a cross-sectional view taken along arrow A-A' of the plan view. Also, FIG. 3 is a cross-sectional view of the inkjet head 21 in which a nozzle substrate 31 is connected to the piezoelectric actuator 21*a*.

The inkjet head 21 includes on a substrate 22 having a plurality of pressure chambers 22*a* (opening portions) a thermally-oxidized film 23, a lower electrode 24, a piezoelectric thin film 25, and an upper electrode 26 in this order.

The substrate 22 is constituted by a semiconductor substrate solely made of single crystal Si (silicon) or a silicon on insulator (SOI) substrate having a thickness of approximately 100 to 300 μm, for example. FIG. 2B illustrates a case in which the substrate 22 is constituted by the SOI substrate. The substrate 22 is prepared by adjusting the thickness of the substrate to approximately 100 to 300 μm by means of polishing of a substrate having a thickness of approximately 750 μm, and the thickness of the substrate 22 may arbitrarily be adjusted in accordance with the device to which the substrate 22 is applied. The aforementioned SOI substrate is prepared by connecting two Si substrates via an oxide film. An upper wall (a wall located further on the piezoelectric thin film forming side than the pressure chamber 22*a*) of the pressure chamber 22*a* of the substrate 22 constitutes a diaphragm 22*b* serving as a driven membrane, is displaced (vibrated) along with driving (expansion and contraction) of the piezoelectric thin film 25, and applies pressure to ink in the pressure chamber 22*a*.

The thermally-oxidized film 23 is $SiO_2$ (silicon oxide) having a thickness of approximately 0.1 μm, for example, and is formed to protect and insulate the substrate 22.

The lower electrode 24 is a common electrode provided in common with the plurality of pressure chambers 22*a* and is prepared by laminating a Ti (titanium) layer and a Pt (platinum) layer. The Ti layer is formed to improve adhesion between the thermally-oxidized film 23 and the Pt layer. The thickness of the Ti layer is approximately 0.02 μm, for example, and the thickness of the Pt layer is approximately 0.1 μm, for example.

The piezoelectric thin film 25 is constituted by a ferroelectric thin film in which a donor element is added to lead zirconate titanate (PZT) and is provided to correspond to each of the pressure chambers 22*a*. The film thickness of the piezoelectric thin film 25 is approximately 1 μm or more and 10 μm or less, for example. Meanwhile, details of the piezoelectric thin film 25 will be described below.

The upper electrode 26 is an individual electrode provided to correspond to each of the pressure chambers 22*a* and is prepared by laminating a Ti layer and a Pt layer. The Ti layer is formed to improve adhesion between the piezoelectric thin film 25 and the Pt layer. The thickness of the Ti layer is approximately 0.02 μm, for example, and the thickness of the Pt layer is approximately 0.1 to 0.2 μm, for example. The upper electrode 26 is provided to interpose the piezoelectric thin film 25 between the upper electrode 26 and the lower electrode 24 in a film thickness direction. It is to be noted that the Pt layer may be replaced with a layer made of gold (Au).

The lower electrode 24, the piezoelectric thin film 25, and the upper electrode 26 constitute a thin film piezoelectric element 27 adapted to eject ink inside the pressure chamber 22*a* outward. The thin film piezoelectric element 27 is driven based on voltage (a driving signal) to be applied from a driving circuit 28 to the lower electrode 24 and the upper electrode 26. The inkjet head 21 is formed by arranging the thin film piezoelectric elements 27 and the pressure chambers 22*a* vertically and horizontally. In the present embodiment, the lower electrode 24 is at a ground potential (0V), and positive driving voltage (positive bias) with reference to the voltage of the lower electrode 24 is applied to the upper electrode 26 by the driving circuit 28.

To a side of the pressure chamber 22*a* opposite the diaphragm 22*b*, the nozzle substrate 31 is connected. The nozzle substrate 31 is provided with an ejection hole (nozzle hole) 31*a* through which ink contained in the pressure chamber 22*a* is ejected outward as an ink droplet. The pressure chamber 22*a* contains ink to be supplied from the middle tank 6.

In the above configuration, when a potential difference is applied between the lower electrode 24 and the upper electrode 26 by application of voltage by the driving circuit 28, the piezoelectric thin film 25 expands and contracts in a direction perpendicular to a thickness direction thereof (a direction parallel to a surface of the substrate 22) in accordance with the potential difference between the lower electrode 24 and the upper electrode 26. Due to a difference in length between the piezoelectric thin film 25 and the diaphragm 22*b*, curvature is generated in the diaphragm 22*b*, and the diaphragm 22*b* is displaced (bent or vibrated) in a thickness direction thereof.

Accordingly, when ink is contained in the pressure chamber 22*a*, the aforementioned vibration of the diaphragm 22*b* causes a pressure wave to propagate to the ink inside the pressure chamber 22*a*, and the ink inside the pressure chamber 22*a* is ejected outward from the ejection hole 31*a* as an ink droplet.

In the present embodiment, since reliability of the piezoelectric thin film 25 can be improved as described below, reliability of the inkjet head 21*a* configured to include the piezoelectric thin film 25 and reliability of the inkjet printer 1 can be improved.

Also, since the aforementioned piezoelectric actuator 21*a* includes the pair of electrodes (the lower electrode 24 and the upper electrode 26) adapted to apply voltage to the piezoelectric thin film 25, with one electrode (for example, the lower electrode 24) set at a ground potential, positive bias is applied to the other electrode (for example, the upper electrode 26) to enable the piezoelectric thin film 25 to expand and contract and enable the piezoelectric actuator 21*a* to be driven.

[Method for Manufacturing Inkjet Head]

Figure 4:
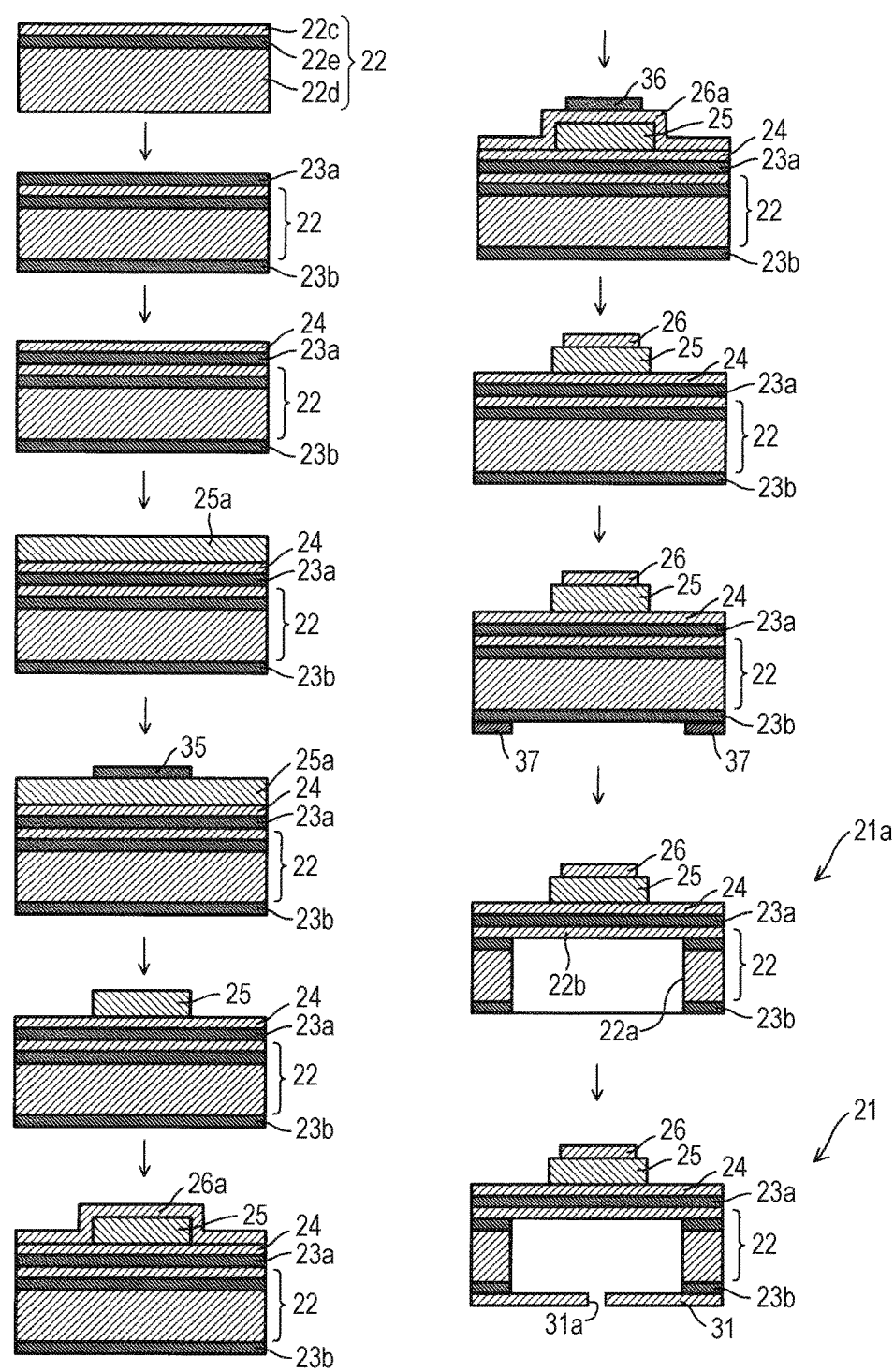
FIG. 4 is a cross-sectional view illustrating a process for manufacturing the inkjet head.

Next, a method for manufacturing the inkjet head 21 according to the present embodiment will be described below. FIG. 4 is a cross-sectional view illustrating a process for manufacturing the inkjet head 21.

First, the substrate 22 is prepared. As the substrate 22, crystal silicon (Si) commonly used for micro electro mechanical systems (MEMS) can be used. Here, a substrate with an SOI structure, in which two Si substrates 22c and 22d are connected via an oxide film 22e, is used.

The substrate 22 is put in a heating furnace and is held for a predetermined period of time at approximately 1500° C. to form thermally-oxidized films 23a and 23b made of $SiO_2$ on surfaces of the Si substrates 22c and 22d, respectively. Subsequently, on one thermally-oxidized film 23a, Ti and Pt layers are sequentially formed by means of sputtering to form the lower electrode 24.

Subsequently, the substrate 22 is heated again at approximately 600° C. to form a PZT layer 25a to which a donor element is added by means of sputtering. Subsequently, a photosensitive resin 35 is applied to the substrate 22 by means of spin coating, and is exposed and etched via a mask to eliminate unnecessary parts of the photosensitive resin 35 to transfer the shape of the piezoelectric thin film 25 to be formed. The shape of the layer 25a is thereafter processed by means of reactive ion etching with the photosensitive resin 35 used as a mask to form the piezoelectric thin film 25.

Subsequently, Ti and Pt layers are sequentially formed on the lower electrode 24 by means of sputtering to cover the piezoelectric thin film 25 to form a layer 26a. Subsequently, a photosensitive resin 36 is applied to the layer 26a by means of spin coating, and is exposed and etched via a mask to eliminate unnecessary parts of the photosensitive resin 36 to transfer the shape of the upper electrode 26 to be formed. The shape of the layer 26a is thereafter processed by means of reactive ion etching with the photosensitive resin 36 used as a mask to form the upper electrode 26.

Subsequently, a photosensitive resin 37 is applied to a rear surface (on a side of the thermally-oxidized film 23b) of the substrate 22 by means of spin coating, and is exposed and etched via a mask to eliminate unnecessary parts of the photosensitive resin 37 to transfer the shape of the pressure chamber 22a to be formed. The substrate 22 is thereafter eliminated and processed by means of reactive ion etching with the photosensitive resin 37 used as a mask to form the pressure chamber 22a, which causes the piezoelectric actuator 21a to be prepared.

Subsequently, the substrate 22 of the piezoelectric actuator 21a and the nozzle substrate 31 including the ejection hole 31a are connected with use of adhesive or the like. Consequently, the inkjet head 21 is completed. Meanwhile, a middle glass substrate having a through hole at a position corresponding to the ejection hole 31a may be used. In this case, the thermally-oxidized film 23b may be eliminated, and the substrate 22 and the middle glass substrate, and the middle glass substrate and the nozzle substrate 31, may be connected by means of anodic bonding. In this case, the three components (the substrate 22, the middle glass substrate, and the nozzle substrate 31) can be connected without use of adhesive.

Meanwhile, an electrode material for the lower electrode 24 is not limited to Pt described above and may be a metal or a metal oxide such as Au (gold), Ir (iridium), $IrO_2$ (iridium oxide), $RuO_2$ (ruthenium oxide), $LaNiO_3$ (LNO; lanthanum nickelate), and $SrRuO_3$ (SRO; strontium ruthenate), or a combination thereof.

[Another Configuration of Inkjet Head]

Figure 5:
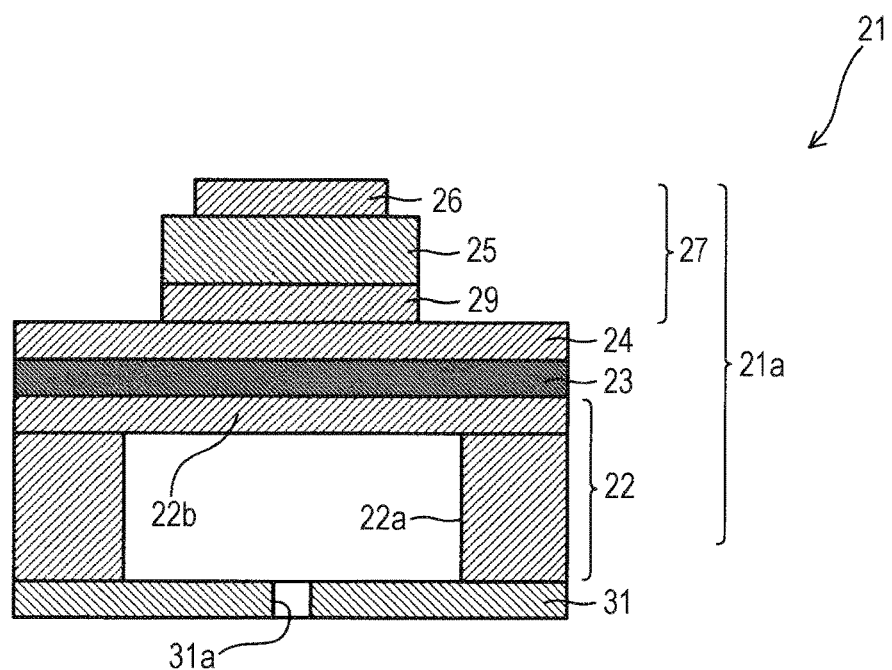
FIG. 5 is a cross-sectional view illustrating another configuration of the inkjet head.

FIG. 5 is a cross-sectional view illustrating another configuration of the inkjet head 21. As illustrated in FIG. 5, a seed layer 29 may be provided between the substrate 22 and the piezoelectric thin film 25, more specifically, between the lower electrode 24 and the piezoelectric thin film 25. The seed layer 29 is an orientation control layer for controlling crystalline orientation of the piezoelectric thin film 25. The seed layer 29 is made of a perovskite-structured oxide such as PLT (lead lanthanum titanate). Meanwhile, a material for the seed layer 29 is not particularly limited as long as the material is a perovskite-structured oxide. Instead of PLT described above, $LaNiO_3$, $SrRuO_3$, $SrTiO_3$ (STO; strontium titanate), PT (lead titanate), or the like can be used.

[About Details of Piezoelectric Thin Film]

Next, details of the aforementioned piezoelectric thin film 25 will be described. In the piezoelectric thin film 25 according to the present embodiment, as a donor element to be added to the PZT, lanthanum (La) or niobium (Nb) can be used, for example. In a case of using La as a donor element, the piezoelectric thin film 25 is constituted by La-added PZT or lead lanthanum zirconate titanate (PLZT). In a case of using Nb as a donor element, the piezoelectric thin film 25 is constituted by Nb-added PZT or lead niobate zirconate titanate (PNZT).

In the piezoelectric thin film 25 according to the present embodiment, the molar ratio of lead (Pb) to the total sum of zirconium (Zr) and titanium (Ti) is 105% or higher, and Pb is excessively added to the total sum of Zr and Ti. Also, in the piezoelectric thin film 25, when positive and negative coercive electric fields in P-E hysteresis representing the relationship between the polarization amount (P) and the electric field (E) are referred to as Ec (+) and Ec (−) (unit: V/μm), respectively, the value of |Ec (+)|/|Ec (−)| 0.5 or more and 1.5 or less.

Since the ratio between the positive and negative coercive electric fields is in the above range, an internal electric field is reduced, and asymmetry of the P-E hysteresis is alleviated even when a donor element (such as La and Nb) is added to the PZT. That is, the P-E hysteresis is approximately in a symmetric shape across the vertical axis (E=0V) (in a shape in which the polarization amounts (absolute values) on the positive and negative electric field sides are approximately symmetric). Accordingly, even when a positive electric field is applied to the piezoelectric thin film 25, polarization is easy to occur. Thus, driving with positive bias, in which positive driving voltage is applied to the upper electrode 26, can be achieved, and a high piezoelectric property can be achieved even with such positive bias driving.

Also, with the positive bias driving, diffusion of oxygen vacancies to the side of the upper electrode 26 in the film can be restricted. Accordingly, breakdown (generation of leak current) caused by the oxygen vacancies and a decrease in piezoelectric displacement due to the breakdown can be restricted. Consequently, reliability of the piezoelectric thin film 25 can be improved.

Also, at the time of an increase of the oxygen vacancies in the film, even in a case in which a piezoelectric property is to be improved with use of non-180° polarization rotation of domains (each domain is a region in which a polarization direction is uniform), a wall between the domains (a domain wall) is pinned by the oxygen vacancies at the time of voltage application. That is, at the time of voltage application, the domain wall does not move, and rotation in the polarization direction does not occur. Consequently, distortion of the crystal does not occur efficiently at the time of voltage application, and the piezoelectric property is lowered.

However, in the present embodiment, since the molar ratio of Pb to the total sum of Zr and Ti is 105% or higher, and the excessive amount of Pb is sufficiently secured, the vacancies of Pb from the crystal can be reduced, and the vacancies of oxygen (oxygen vacancies) along with the vacancies of Pb can be reduced. Due to the reduction of the oxygen vacancies, movement of the domain wall and rotation in the polarization direction at the time of voltage application occur easily, distortion of the crystal occurs efficiently, and the piezoelectric property can be improved.

Also, due to the reduction of the oxygen vacancies, a temporal change of the piezoelectric property caused by movement of the oxygen vacancies resulting from application of heat or an electric field (lowering of the piezoelectric property along with long-term use) can be restricted. Further, since the excessive amount of Pb is sufficiently secured, the piezoelectric thin film 25 can be constituted by a dense film in which connecting strength at a grain boundary between crystals is improved and can be a film excellent in crystallinity even at a first stage of film formation (on the interface side with the lower electrode 24). Thus, exfoliation of the piezoelectric thin film 25 from the lower electrode 24 can be reduced. Accordingly, reliability of the film can be improved not only in terms of reduction of breakdown caused by diffusion of the oxygen vacancies but also in terms of reduction of a temporal change of the piezoelectric property and film exfoliation.

Also, in a case in which the excessive amount of Pb is small, the piezoelectric property easily varies depending on the position in the wafer at the time of film formation, and in-plane uniformity of the piezoelectric property is lowered. However, since the excessive amount of Pb is sufficiently secured as described above, the aforementioned in-plane variation of the piezoelectric property can be reduced, and the in-plane uniformity can be improved.

In the aforementioned piezoelectric thin film 25, internal stress of the film (hereinbelow referred to as film stress as well) is desirably 50 MPa or more and 250 MPa or less. The internal stress of the film means stress that the film itself originally has.

As a result of consideration, it has been found that, by reducing the oxygen vacancies, the excessive amount of lead, and the amount of the donor element at the crystal grain boundary in the piezoelectric thin film 25, the excessive lead and the added donor element are taken into the perovskite-structured crystal, and the dense film in which the connecting strength at the grain boundary between crystals is improved can be obtained. In the dense film, the film stress increases and has a value of 50 MPa or more. At this time, maldistribution of ions in the film is solved. That is, the film having the film stress of 50 MPa or more can reliably alleviate the asymmetry of the P-E hysteresis. Conversely, when the film stress is less than 50 MPa, the dense film is difficult to be obtained, the oxygen vacancies and the excessive positive ions are distributed at the crystal grain boundary, and the P-E hysteresis becomes asymmetric.

On the other hand, when the film stress is more than 250 MPa, a crack or exfoliation of the film is generated, and reliability of the film is lowered. For this reason, by setting the film stress to 250 MPa or less, the crack and exfoliation are prevented from being generated, and reliability of the film can reliably be improved.

Also, breaking stress of the film is desirably 400 MPa or more. The breaking stress of the film means stress when the film to which stress is applied from outside starts breaking. When the breaking stress of the film is 400 MPa or more, breakage of the film due to an external force is difficult to occur, durability of the film is reliably improved, and reliability of the film can further be improved.

In a case in which the piezoelectric thin film 25 is La-added PZT (or PLZT), the molar ratio of La to the total sum of Zr and Ti is desirably 6% or more and 10% or less, and the molar ratio of Zr to the total sum of Zr and Ti is desirably 54% or more and 59% or less. Also, in a case in which the piezoelectric thin film 25 is Nb-added PZT (or PNZT), the molar ratio of Nb to the total sum of Zr and Ti is desirably 10% or more and 20% or less, and the molar ratio of Zr to the total sum of Zr and Ti is desirably 52% or more and 59% or less.

By setting the La ratio and the Zr ratio in the PLZT, and setting the Nb ratio and the Zr ratio in the PNZT, as described above, the piezoelectric thin film 25 enabling the asymmetry of the P-E hysteresis to be alleviated and having the ratio of the coercive electric fields fall within the aforementioned range can reliably be achieved, and the internal stress of the film can easily be set in the aforementioned range.

As described above, with the piezoelectric thin film 25 according to the present embodiment, even with a configuration in which a donor element is added to the PZT, lowering of the piezoelectric property along with long-term use, film exfoliation, and breakdown can be reduced, and reliability of the film can be improved. Accordingly, by supporting the piezoelectric thin film 25 according to the present embodiment with the substrate 22 to form the piezoelectric actuator 21a, lowering of the property and a driving failure can be reduced even with long-term use, and the highly-reliable piezoelectric actuator 21a can be achieved.

Also, in the configuration in which the seed layer 29 is provided between the substrate 22 and the piezoelectric thin film 25 as in FIG. 5, on the seed layer 29, the piezoelectric thin film 25 having the same crystal structure (for example, the perovskite structure) as that of the seed layer 29 is formed, and a high piezoelectric property can easily be achieved. Accordingly, the piezoelectric thin film 25 with a high piezoelectric property and high reliability can easily be achieved.

Also, the seed layer 29 is desirably constituted by the PLT. In a case in which the PZT to which a donor element has been added (piezoelectric thin film 25) is formed on the seed layer 29 constituted by the PLT, both the PZT and the PLT contain lead, and a composition difference of the piezoelectric thin film 25 is thus difficult to occur. Thus, the piezoelectric thin film 25 enabling the asymmetry of the P-E hysteresis to be alleviated and having the aforementioned specific composition can reliably be formed. Also, since the PLT has the perovskite structure, this facilitates forming of the piezoelectric thin film 25 having the perovskite structure on the seed layer 29, and a high piezoelectric property can reliably be achieved.

In the above configuration of providing the seed layer 29, the piezoelectric thin film 25 is desirably formed on the seed layer 29 at a film forming rate of 2.5 μm/h or less. By providing the seed layer 29, the piezoelectric thin film 25 is formed at such a low film forming rate as described above, and the internal stress of the piezoelectric thin film 25 can be controlled within the aforementioned appropriate range. As a result, the piezoelectric thin film 25 having the ratio of the coercive electric fields fall within the aforementioned range can reliably be formed, and the asymmetry of the P-E hysteresis can reliably be alleviated.

EXAMPLES

Figure 6:
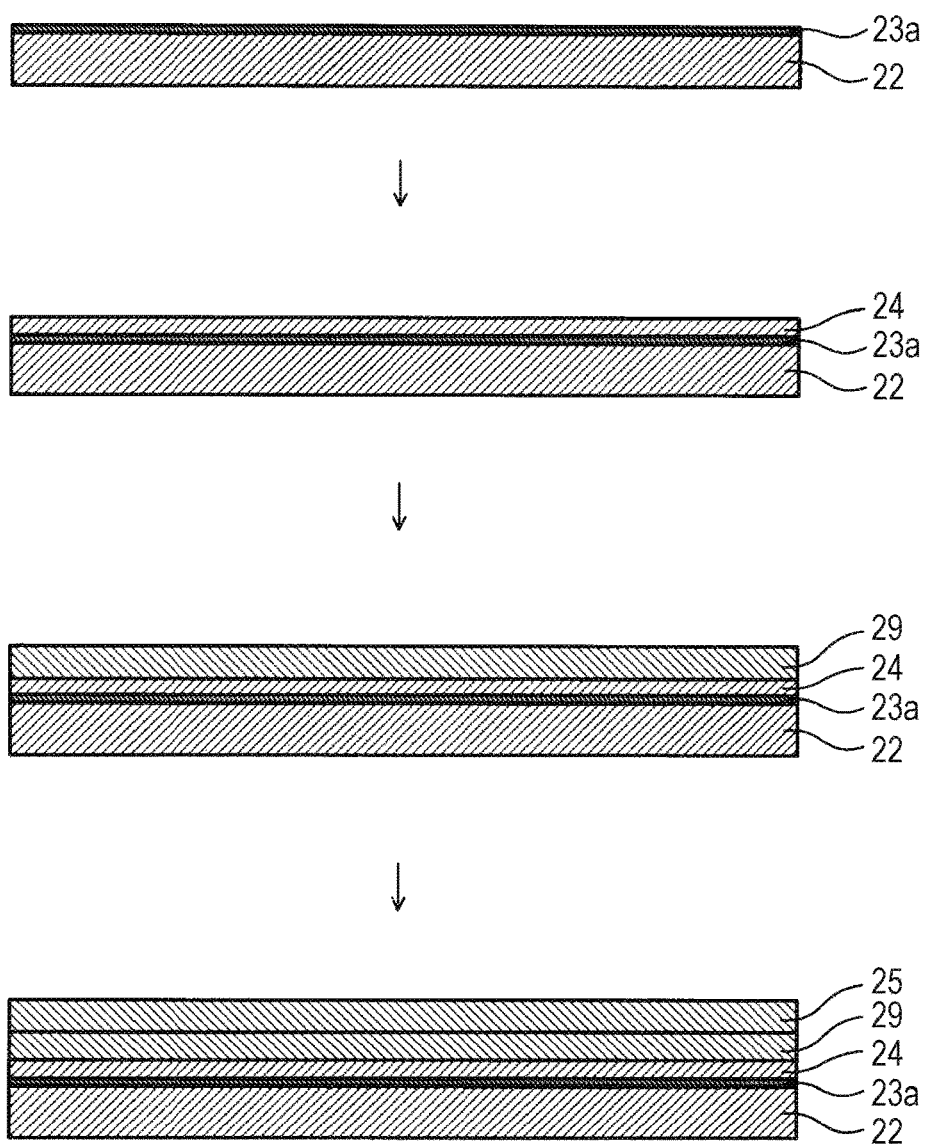
FIG. 6 is a cross-sectional view illustrating a part of a process for manufacturing the piezoelectric actuator.

Hereinbelow, specific examples of the piezoelectric thin film 25 according to the present embodiment including a method for manufacturing the piezoelectric thin film will be described. Comparative examples will also be described for comparison with the examples. FIG. 6 is a cross-sectional view illustrating a part of a process for manufacturing the piezoelectric actuator 21a.

Example 1

First, on the substrate 22, which is a single crystal Si wafer having a thickness of approximately 625 µm, the thermally-oxidized film 23a having a thickness of approximately 100 nm was formed. The thickness and the diameter of the wafer may be normal values such as 300 µm to 725 µm and 3 inches to 8 inches, respectively. The thermally-oxidized film 23a can be formed by exposing the Si wafer to a high temperature of approximately 1200° C. in an oxygen atmosphere in a wet oxidation furnace.

Subsequently, by means of sputtering, on the Si substrate with the thermally-oxidized film, a Ti layer having a thickness of approximately 10 nm was formed as an adhesion layer, and a Pt layer having a thickness of approximately 150 nm was formed, to form the lower electrode 24. Ti sputtering conditions at this time were an Ar flow rate of 20 sccm, pressure of 0.5 Pa, RF power to be applied to a target of 100 W, and a substrate temperature of 400° C. Also, Pt sputtering conditions at this time were an Ar flow rate of 20 sccm, pressure of 0.5 Pa, RF power to be applied to a target of 150 W, and a substrate temperature of 400° C.

Meanwhile, the Ti and Pt layers were formed with use of a dual sputtering system having two targets for Ti and Pt in a chamber. Thus, the laminated structure of the Pt/Ti/Si substrate can be formed continuously without taking the substrate out of vacuum.

Subsequently, with use of a sputtering system, PLT having a thickness of approximately 20 nm was formed on the Pt to form the seed layer 29. PLT sputtering conditions were an Ar flow rate of 20 sccm, an $O_2$ flow rate of 0.3 sccm, pressure of 0.5 Pa, a substrate temperature of 600° C., and RF power to be applied to a target of 500 W. As the target for sputtering, one having the La/Ti molar ratio of 10/100 was used.

Subsequently, with use of a sputtering system, PLZT having a thickness of approximately 3 µm was formed on the PLT to form the piezoelectric thin film 25. PLZT sputtering conditions were an Ar flow rate of 20 sccm, an $O_2$ flow rate of 0.6 sccm, pressure of 0.5 Pa, a substrate temperature of 600° C., and RF power to be applied to a target of 250 W. The film forming rate of the piezoelectric thin film 25 under the film forming conditions was 2.0 µm/h. By forming the piezoelectric thin film 25 at such a low rate, the dense film in which the connecting strength at the crystal grain boundary between crystals is improved can be formed. As the target for sputtering, one having the Zr/Ti molar ratio of 54/46, having 6 mol % of La added thereto, was used.

The Pb contained in the PLT and PLZT targets easily re-evaporates at the time of the high-temperature film forming, and the formed thin film tends to lack in Pb. Thus, more Pb is required to be added than the stoichiometric ratio in a perovskite crystal. The amount of Pb in the targets is desirably increased by 10 to 30 mol % of the stoichiometric ratio although the amount of Pb depends on the film forming temperature.

Figure 7:
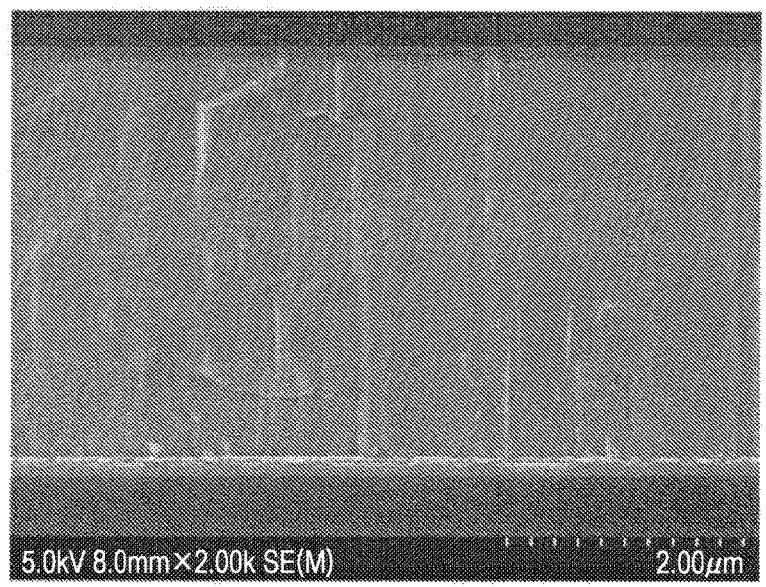
FIG. 7 illustrates a cross-sectional SEM image of a PLZT film in Example 1.

As a result of measuring the formed PLZT film by means of X-ray diffraction (XRD), the degree of (100) orientation of the film was 90%. Also, the cross-sectional shape of the formed PLZT film was confirmed by means of a scanning electron microscope (SEM), and it was found that columnar crystals into which crystals had grown in the film thickness direction were obtained. Also, the Si substrate was cleaved, and the cross-section of the PLZT film split along the cleaved surface was observed. FIG. 7 illustrates a cross-sectional SEM image of the PLZT film in Example 1. As in FIG. 7, the fracture surface of the PLZT film is formed not only at the crystal grain boundary but also in the crystal grain. It was confirmed that the grain boundary of the PLZT film was dense (the connecting strength at the grain boundary between crystals was high).

Further, the composition of the PLZT film was analyzed by means of energy dispersive X-ray spectroscopy (EDX). As a result of the analysis, the Zr/Ti molar ratio was 54.1/45.9 (the molar ratio of Zr to (Zr+Ti) was 54.1%), the molar addition ratio of La to (Zr+Ti) was 6.2%, and a film having a composition close to the target composition was obtained. The ratio of Pb to the film was 1.05, which was excessive by 5 mol %. That is, the molar ratio of Pb to (Zr+Ti) was 105%.

Also, warp of the wafer was measured before and after formation of the PLZT film, and internal stress of the PLZT film (film stress) was derived based on the following equation. The resulting film stress was 100 MPa.

$$\sigma = \frac{1}{3d} \frac{Es}{1-vs} D^2 \frac{h_2 - h_1}{a^2} \quad \text{[Equation 1]}$$

In this equation, d represents the film thickness, D represents the thickness of the wafer, Es represents the longitudinal elastic coefficient of the wafer, vs represents the Poisson ratio of the wafer, a represents the radius of the substrate, $h_2$ represents the warp of the wafer after film formation, and $h_1$ represents the warp of the wafer before film formation. In the case of the Si substrate used in the present example, Es is 160 [GPa], and vs is 0.2.

Figure 8:
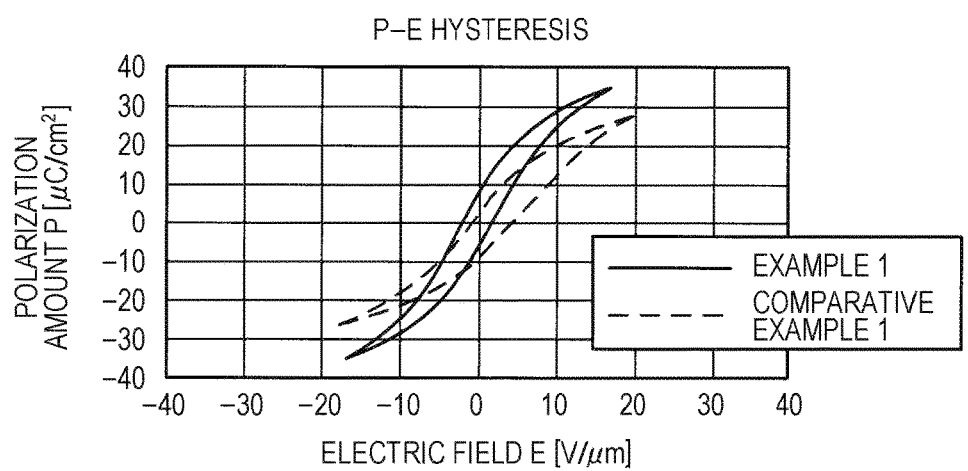
FIG. 8 is a graph illustrating P-E hysteresis curves of PLZT films in Example 1 and Comparative Example 1.

Subsequently, the P-E hysteresis of the PLZT film was measured with use of a Sawyer Tower circuit. FIG. 8 illustrates P-E hysteresis curves of PLZT films in Example 1 and Comparative Example 1 described below. As in FIG. 8, in Example 1, the hysteresis curve is well symmetric across the vertical axis (E=0V). Based on the graph, with the value of the positive coercive electric field referred to as Ec (+) and the value of the negative coercive electric field referred to as Ec (−), the absolute value thereof |Ec (+) | and the absolute value thereof |Ec (−) | were derived. As a result, |Ec (+) |=1.9 [V/µm] and |Ec (−) |=1.7 [V/µm] were obtained. The ratio therebetween was |Ec (+) |/|Ec (−) |=1.1.

Thereafter, with use of a substrate with the aforementioned piezoelectric thin film, the piezoelectric thin film 25 was patterned in a similar manner to FIG. 4 to manufacture the inkjet head 21. Meanwhile, FIG. 4 illustrates a method for manufacturing the inkjet head 21 with no seed layer. However, in a case in which the seed layer is provided, the piezoelectric thin film 25 in FIG. 4 may be replaced with the piezoelectric thin film 25 and the seed layer 29.

Subsequently, with use of the manufactured inkjet head 21, the piezoelectric property and the reliability of the piezoelectric thin film 25 were considered.

The piezoelectric property was derived from the displacement amount and the design shape of the actuator by calculation with use of ANSYS, which was finite element method simulation software. As a result, the piezoelectric constant with positive bias driving was $d_{31}$ (+)=−251 [pm/V] while the piezoelectric constant with negative bias driving was $d_{31}$ (−)=−253 [pm/V]. On each of the poles, a high piezoelectric property exceeding 250 [pm/V] in terms of an absolute value was obtained.

Figure 9:
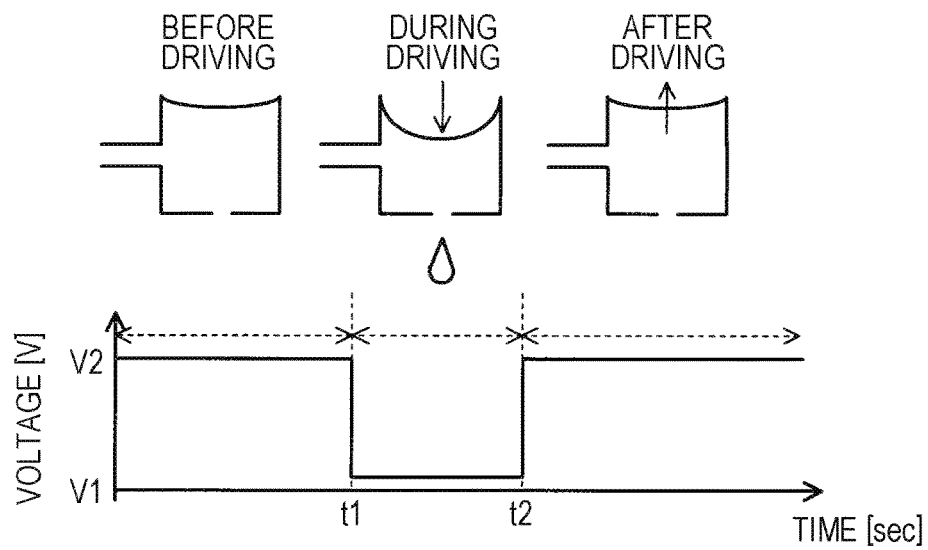
FIG. 9 illustrates a driving waveform of the inkjet head in Example 1.

Also, as for the reliability of the film, a durability test was performed by continuously applying a basic driving waveform as illustrated in FIG. 9 to the inkjet head filled with ink at a frequency of 30 kHz to continuously drive the head. After the head was driven ten billion times with positive bias, the temporal change of the ejection property and the temporal change of the appearance of the piezoelectric thin film were observed to examine whether or not lowering of the displacement property, breakdown due to leak current, and exfoliation of the piezoelectric thin film occurred.

In the inkjet head manufactured in the present example, none of the lowering of the displacement property, the breakdown, and the film exfoliation occurred even after ten-billion-time driving.

Finally, to examine the breaking stress of the piezoelectric thin film, with use of a channel that was not used in the continuous durability test, while the driving voltage was gradually increased, voltage at which the crack breakage was generated in the piezoelectric thin film was measured to examine how much stress was applied to the film at the time of breakage. As a result, the breaking stress of the film was 548 [MPa].

Example 2

The process until formation of the seed layer 29 (PLT film) is similar to that in Example 1. On a manufactured PLT/Pt/Ti/Si substrate, a PLZT film serving as the piezoelectric thin film 25 having a thickness of approximately 4 µm was formed by means of sputtering. PLZT sputtering conditions were an Ar flow rate of 20 sccm, an $O_2$ flow rate of 0.8 sccm, pressure of 0.5 Pa, a substrate temperature of 550° C., and RF power to be applied to a target of 250 W. The film forming rate of the PLZT film under the film forming conditions was 1.9 µm/h. As the target for sputtering, one having the Zr/Ti molar ratio of 58/42, having 8 mol % of La added thereto, was used.

As a result of measuring the obtained PLZT film by means of XRD, the degree of (100) orientation of the film was 99%. Also, the cross-sectional shape of the PLZT film was observed by means of a SEM, and it was found that columnar crystals into which crystals had grown in the film thickness direction were obtained. From the cross-sectional shape, it was confirmed that a dense grain boundary was obtained in a similar manner to Example 1.

Further, the composition of the PLZT film was analyzed by means of EDX. As a result of the analysis, the Zr/Ti molar ratio was 58.9/41.1 (the molar ratio of Zr to (Zr+Ti) was 58.9%), the molar addition ratio of La to (Zr+Ti) was 7.9%, and a film having a composition close to the target composition was obtained. The ratio of Pb to the film was 1.09, which was excessive by 9 mol %. That is, the molar ratio of Pb to (Zr+Ti) was 109%. Also, in a similar manner to Example 1, warp of the wafer was measured before and after formation of the PLZT film, and film stress was derived. The resulting film stress was 200 MPa.

Subsequently, the P-E hysteresis of the PLZT film was measured in a similar method to Example 1. Based on a hysteresis curve in Example 2, the absolute values of the positive and negative coercive electric fields |Ec (+) | and |Ec (−) | were derived. As a result, |Ec (+)|=1.7 [V/µm] and |Ec (−) |=2.0 [V/µm] were obtained. The ratio therebetween was |Ec (+) |/|Ec (−)|=0.9.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−254 [pm/V] while the piezoelectric constant with negative bias driving was $d_{31}$ (−)=−251 [pm/V]. On each of the poles, a high piezoelectric property exceeding 250 [pm/V] in terms of an absolute value was obtained. It was also found that the reliability after continuous driving had no problem.

Finally, the breaking stress of the PLZT film was examined in a similar manner to Example 1, and it was found that the breaking stress of the film was 421 [MPa].

Example 3

The process until formation of the seed layer 29 (PLT film) is similar to that in Example 1. On a manufactured PLT/Pt/Ti/Si substrate, a PNZT film serving as the piezoelectric thin film 25 having a thickness of approximately 3 µm was formed by means of sputtering. PNZT sputtering conditions were an Ar flow rate of 20 sccm, an $O_2$ flow rate of 1.0 sccm, pressure of 0.5 Pa, a substrate temperature of 550° C., and RF power to be applied to a target of 300 W The film forming rate of the PNZT film under the film forming conditions was 2.0 µm/h. As the target for sputtering, one having the Zr/Ti molar ratio of 52/48, having 10 mol % of Nb added thereto, was used.

As a result of measuring the obtained PNZT film by means of XRD, the degree of (100) orientation of the film was 99%. Also, the cross-sectional shape of the PNZT film was observed by means of a SEM, and it was found that columnar crystals into which crystals had grown in the film thickness direction were obtained. From the cross-sectional shape, it was confirmed that a dense grain boundary was obtained in a similar manner to Example 1.

Further, the composition of the PNZT film was analyzed by means of EDX. As a result of the analysis, the Zr/Ti molar ratio was 52.5/47.5 (the molar ratio of Zr to (Zr+Ti) was 52.5%), the molar addition ratio of Nb to (Zr+Ti) was 10.1%, and a film having a composition close to the target composition was obtained. The ratio of Pb to the film was 1.08, which was excessive by 8 mol %. That is, the molar ratio of Pb to (Zr+Ti) was 108%. Also, in a similar manner to Example 1, warp of the wafer was measured before and after formation of the PNZT film, and film stress was derived. The resulting film stress was 180 MPa.

Subsequently, the P-E hysteresis of the PNZT film was measured in a similar method to Example 1. Based on a hysteresis curve in Example 3, the absolute values of the positive and negative coercive electric fields |Ec (+) | and |Ec (−) | were derived. As a result, |Ec (+)|=2.0 [V/µm] and |Ec (−) |=1.9 [V/µm] were obtained. The ratio therebetween was |Ec (+) |/|Ec (−) |=1.1.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−260 [pm/V] while the piezoelectric constant with negative bias driving was $d_{31}$ (−)=−259 [pm/V]. On each of the poles, a high piezoelectric property exceeding 250 [pm/V] in terms of an absolute value was obtained. It was also found that the reliability after continuous driving had no problem.

Finally, the breaking stress of the PNZT film was examined in a similar manner to Example 1, and it was found that the breaking stress of the film was 465 [MPa].

Example 4

The process until formation of the seed layer 29 (PLT film) is similar to that in Example 1. On a manufactured PLT/Pt/Ti/Si substrate, a PNZT film serving as the piezoelectric thin film 25 having a thickness of approximately 4 µm was formed by means of sputtering. PNZT sputtering conditions were an Ar flow rate of 20 sccm, an $O_2$ flow rate of 1.0 sccm, pressure of 0.5 Pa, a substrate temperature of 520° C., and RF power to be applied to a target of 300 W The film forming rate of the PNZT film under the film forming conditions was 2.4 µm/h. As the target for sputtering, one having the Zr/Ti molar ratio of 58/42, having 20 mol % of Nb added thereto, was used.

As a result of measuring the obtained PNZT film by means of XRD, the degree of (100) orientation of the film was 99%. Also, the cross-sectional shape of the PNZT film was observed by means of a SEM, and it was found that columnar crystals into which crystals had grown in the film thickness direction were obtained. From the cross-sectional shape, it was confirmed that a dense grain boundary was obtained in a similar manner to Example 1.

Further, the composition of the PNZT film was analyzed by means of EDX. As a result of the analysis, the Zr/Ti molar ratio was 58.9/41.1 (the molar ratio of Zr to (Zr+Ti) was 58.9%), the molar addition ratio of Nb to (Zr+Ti) was 19.9%, and a film having a composition close to the target composition was obtained. The ratio of Pb to the film was 1.14, which was excessive by 14 mol %. That is, the molar ratio of Pb to (Zr+Ti) was 114%. Also, in a similar manner to Example 1, warp of the wafer was measured before and after formation of the PNZT film, and film stress was derived. The resulting film stress was 250 MPa.

Subsequently, the P-E hysteresis of the PNZT film was measured in a similar method to Example 1. Based on a hysteresis curve in Example 4, the absolute values of the positive and negative coercive electric fields |Ec (+) | and |Ec (−) | were derived. As a result, |Ec (+)|=3.0 [V/µm] and |Ec (−) |=2.1 [V/µm] were obtained. The ratio therebetween was |Ec (+) |/|Ec (−) |=1.4.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−251 [pm/V] while the piezoelectric constant with negative bias driving was $d_{31}$ (−)=−254 [pm/V]. On each of the poles, a high piezoelectric property exceeding 250 [pm/V] in terms of an absolute value was obtained. It was also found that the reliability after continuous driving had no problem.

Finally, the breaking stress of the PNZT film was examined in a similar manner to Example 1, and it was found that the breaking stress of the film was 405 [MPa].

Comparative Example 1

The process until formation of the seed layer (PLT film) is similar to that in Example 1. On a manufactured PLT/Pt/Ti/Si substrate, a PLZT film serving as a piezoelectric thin film having a thickness of approximately 3 µm was formed by means of sputtering. PLZT sputtering conditions were an Ar flow rate of 20 sccm, an $O_2$ flow rate of 0.8 sccm, pressure of 0.5 Pa, a substrate temperature of 550° C., and RF power to be applied to a target of 500 W. The film forming rate of the PLZT film under the film forming conditions was 4.0 µm/h. As the target for sputtering, a similar target to that in Example 1 was used. That is, one having the Zr/Ti molar ratio of 54/46, having 6 mol % of La added thereto, was used.

Figure 10:
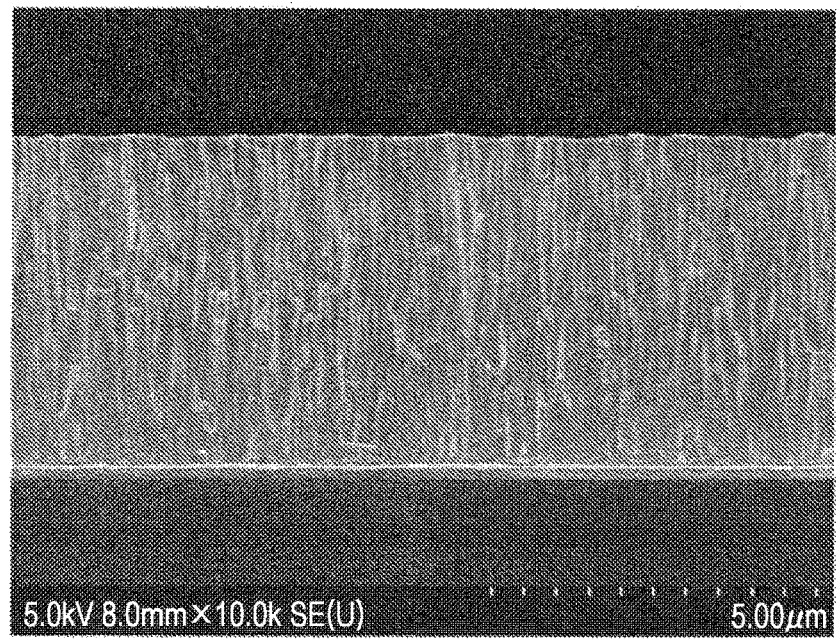
FIG. 10 illustrates a cross-sectional SEM image of the PLZT film in Comparative Example 1.
Figure 11:
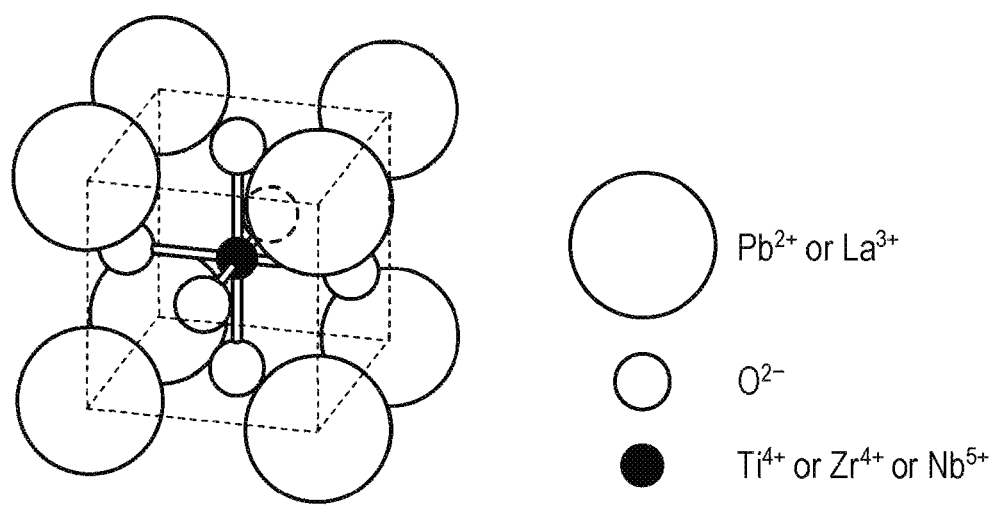
FIG. 11 schematically illustrates a crystal structure of a piezoelectric body.

As a result of measuring the obtained PLZT film by means of XRD, the degree of (100) orientation of the film was 97%. Also, in a similar manner to Example 1, the Si substrate was cleaved, and the cross-section of the PLZT film split along the cleaved surface was observed with use of a SEM. FIG. 10 illustrates a cross-sectional SEM image of the PLZT film in Comparative Example 1. As in FIG. 10, the PLZT film in Comparative Example 1 fractured mainly along the grain boundary, and the connecting strength at the grain boundary between crystal grains was low. This indicates that the crystal grain boundary has heterophase and is not dense.

Further, the composition of the PLZT film was analyzed by means of EDX. As a result of the analysis, the Zr/Ti molar ratio was 54.2/45.8 (the molar ratio of Zr to (Zr+Ti) was 54.2%), the molar addition ratio of La to (Zr+Ti) was 6.0%, and a film having a composition close to the target composition was obtained. The ratio of Pb to the film was 1.01, which was excessive by 1 mol %. That is, the molar ratio of Pb to (Zr+Ti) was 101%. Also, in a similar manner to Example 1, warp of the wafer was measured before and after formation of the PLZT film, and film stress was derived. The resulting film stress was 90 MPa.

Subsequently, the P-E hysteresis of the PLZT film was measured in a similar method to Example 1. The P-E hysteresis in Comparative Example 1 is illustrated in FIG. 8. The absolute values of the positive and negative coercive electric fields |Ec (+) | and |Ec (−)|were derived from this hysteresis curve. As a result, |Ec (+) |=4.6 [V/µm] and |Ec (−) |=1.0 [V/µm] were obtained. The ratio therebetween was |Ec (+) |/|Ec (−) |=4.6.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−170 [pm/V] while the piezoelectric constant with negative bias driving was $d_{31}$ (−)=−252 [pm/V]. That is, as illustrated in FIG. 8, since asymmetry of the hysteresis occurred in Comparative Example 1, the piezoelectric property with positive bias driving was relatively low.

The reliability was evaluated with negative bias driving to apply similar piezoelectric displacement to that in Example 1. As a result, a decrease in piezoelectric displacement occurred after ten-billion-time driving, and it was found that the reliability was problematic.

Finally, the breaking stress of the PLZT film was examined in a similar manner to Example 1, and it was found that the breaking stress of the film was 268 [MPa].

Comparative Example 2

The process until formation of the seed layer (PLT film) is similar to that in Example 1. On a manufactured PLT/Pt/Ti/Si substrate, a PLZT film serving as a piezoelectric thin film having a thickness of approximately 4 µm was formed by means of sputtering. PLZT sputtering conditions were an Ar flow rate of 20 sccm, an $O_2$ flow rate of 0.6 sccm, pressure of 0.3 Pa, a substrate temperature of 600° C., and RF power to be applied to a target of 250 W. The film forming rate of the PLZT film under the film forming conditions was 2.0 µm/h. As the target for sputtering, a similar target to that in Example 1 was used. That is, one having the Zr/Ti molar ratio of 54/46, having 6 mol % of La added thereto, was used.

As a result of measuring the obtained PLZT film by means of XRD, the degree of (100) orientation of the film was 99%. Also, the cross-sectional shape of the PLZT film was observed by means of a SEM, and it was found that columnar crystals into which crystals had grown in the film thickness direction were obtained. From the cross-sectional shape, it was confirmed that a dense grain boundary was obtained in a similar manner to Example 1.

Further, the composition of the PLZT film was analyzed by means of EDX. As a result of the analysis, the Zr/Ti molar ratio was 54.0/46.0 (the molar ratio of Zr to (Zr+Ti) was 54.0%), the molar addition ratio of La to (Zr+Ti) was 6.2%, and a film having a composition close to the target composition was obtained. The ratio of Pb to the film was 1.01, which was excessive by 1 mol %. That is, the molar ratio of Pb to (Zr+Ti) was 101%. Also, in a similar manner to Example 1, warp of the wafer was measured before and after formation of the PLZT film, and film stress was derived. The resulting film stress was 150 MPa.

Subsequently, the P-E hysteresis of the PLZT film was measured in a similar method to Example 1. Based on a hysteresis curve in Comparative Example 2, the absolute values of the positive and negative coercive electric fields |Ec (+)| and |Ec (−)| were derived. As a result, |Ec (+)|=1.6 [V/μm] and Ec (−)|=2.3 [V/μm] were obtained. The ratio therebetween was |Ec (+)|/|Ec (−)|=0.7.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−255 [pm/V] while the piezoelectric constant with negative bias driving was $d_{31}$ (−)=−248 [pm/V]. It was found that a high piezoelectric property was obtained even with positive bias driving. However, it was confirmed after ten-billion-time driving that film exfoliation of the piezoelectric thin film occurred, and it was found that the reliability was problematic.

Finally, the breaking stress of the PLZT film was examined in a similar manner to Example 1, and it was found that the breaking stress of the film was 485 [MPa].

Comparative Example 3

The process until formation of the seed layer (PLT film) is similar to that in Example 1. On a manufactured PLT/Pt/Ti/Si substrate, a PNZT film serving as a piezoelectric thin film having a thickness of approximately 3 μm was formed by means of sputtering. PNZT sputtering conditions were an Ar flow rate of 20 sccm, an $O_2$ flow rate of 0.8 sccm, pressure of 1.0 Pa, a substrate temperature of 600° C., and RF power to be applied to a target of 400 W. The film forming rate of the PNZT film under the film forming conditions was 3.0 μm/h. As the target for sputtering, a similar target to that in Example 4 was used. That is, one having the Zr/Ti molar ratio of 58/42, having 20 mol % of Nb added thereto, was used.

As a result of measuring the obtained PNZT film by means of XRD, the degree of (100) orientation of the film was 95%. Also, the cross-sectional shape of the PNZT film was observed by means of a SEM, and it was found that columnar crystals into which crystals had grown in the film thickness direction were obtained. However, in a similar manner to Comparative Example 1, the PNZT film in Comparative Example 3 fractured mainly along the grain boundary, and it seems that the connecting strength at the grain boundary between crystal grains was low.

Further, the composition of the PNZT film was analyzed by means of EDX. As a result of the analysis, the Zr/Ti molar ratio was 58.1/41.9 (the molar ratio of Zr to (Zr+Ti) was 58.1%), the molar addition ratio of Nb to (Zr+Ti) was 19.5%, and a film having a composition close to the target composition was obtained. The ratio of Pb to the film was 1.10, which was excessive by 10 mol %. That is, the molar ratio of Pb to (Zr+Ti) was 110%. Also, in a similar manner to Example 1, warp of the wafer was measured before and after formation of the PNZT film, and film stress was derived. The resulting film stress was 260 MPa. Since the film stress was high in this manner, it was confirmed that the PNZT film partially cracked.

Subsequently, the P-E hysteresis of the PNZT film was measured in a similar method to Example 1. Based on a hysteresis curve in Comparative Example 3, the absolute values of the positive and negative coercive electric fields |Ec (+)| and |Ec (−)| were derived. As a result, |Ec (+)|=6.8 [V/μm] and Ec (−)|=0.8 [V/μm] were obtained. The ratio therebetween was |Ec (+)|/|Ec (−)|=8.5.

Also, with use of a substrate with the aforementioned piezoelectric thin film, an inkjet head was manufactured in a similar manner to Example 1, and the piezoelectric property and the reliability were evaluated. As a result, the piezoelectric constant with positive bias driving was $d_{31}$ (+)=−132 [pm/V] while the piezoelectric constant with negative bias driving was $d_{31}$ (−)=−260 [pm/V]. That is, since asymmetry of the hysteresis occurred, the piezoelectric property with positive bias driving was relatively low.

The reliability was evaluated with negative bias driving to apply similar piezoelectric displacement to that in Example 1. As a result, breakdown due to leak current at the end portion of the upper electrode occurred after ten-billion-time driving, and it was found that the reliability was problematic.

Finally, the breaking stress of the PNZT film was examined in a similar manner to Example 1, and it was found that the breaking stress of the film was 202 [MPa].

Table 1 summarizes the results of Examples 1 to 4 and Comparative Examples 1 to 3. It is to be noted that, in Table 1, evaluation criteria from a viewpoint of the piezoelectric property and the film reliability are as follows.

<<Evaluation Criteria>>

○: A high piezoelectric property is obtained with positive bias driving, and the film reliability has no problem (none of the decrease in piezoelectric displacement, the film exfoliation, and the breakdown occur after long-term driving).

x: A high piezoelectric property is not obtained with positive bias driving, and/or the film reliability is problematic (any of the decrease in piezoelectric displacement, the film exfoliation, and the breakdown occurs after long-term driving).

TABLE 1

| | |Ec(+)|/|Ec(−)| | Pb [mol %] | FILM STRESS [MPa] | FILM FORMING RATE [μm/h] | PIEZOELECTRIC CONSTANT $d_{31}$ (+) [-pm/V] | DURABILITY AND RELIABILITY | FILM BREAKING STRESS [MPa] | EVALUATION |
|---|---|---|---|---|---|---|---|---|
| TARGET VALUE | 0.5 TO 1.5 | 105 OR MORE | 50 TO 250 | 2.5 OR LESS | 250 OR MORE | NO PROBLEM | 400 OR MORE | — |

TABLE 1-continued

| | $|Ec(+)|/|Ec(-)|$ | Pb [mol %] | FILM STRESS [MPa] | FILM FORMING RATE [μm/h] | PIEZOELECTRIC CONSTANT $d_{31}$ (+) [-pm/V] | DURABILITY AND RELIABILITY | FILM BREAKING STRESS [MPa] | EVALUATION |
|---|---|---|---|---|---|---|---|---|
| EXAMPLE 1 (PLZT) | 1.1 | 105 | 100 | 2.0 | 251 | NO PROBLEM | 548 | ○ |
| EXAMPLE 2 (PLZT) | 0.9 | 109 | 200 | 1.9 | 254 | NO PROBLEM | 421 | ○ |
| EXAMPLE 3 (PNZT) | 1.1 | 108 | 180 | 2.0 | 260 | NO PROBLEM | 465 | ○ |
| EXAMPLE 4 (PNZT) | 1.4 | 114 | 250 | 2.4 | 251 | NO PROBLEM | 405 | ○ |
| COMPARATIVE EXAMPLE 1 (PLZT) | 4.6 | 101 | 90 | 4.0 | 170 | DECREASE IN PIEZOELECTRIC DISPLACEMENT | 268 | X |
| COMPARATIVE EXAMPLE 2 (PLZT) | 0.7 | 101 | 150 | 2.0 | 255 | FILM EXFOLIATION | 485 | X |
| COMPARATIVE EXAMPLE 3 (PNZT) | 8.5 | 110 | 260 | 3.0 | 132 | BREAKDOWN | 202 | X |

It can be inferred from Table 1 that, in a case in which the molar ratio of Pb to (Zr+Ti) is 105% or more, and in which the ratio between the positive and negative coercive electric fields of the P-E hysteresis (|Ec (+) |/| Ec (−) |) is 0.5 or more and 1.5 or less, asymmetry of P-E hysteresis is alleviated, a high piezoelectric property is achieved even with positive bias driving, a temporal change of the piezoelectric property, film exfoliation, breakdown due to leak current, and the like are prevented, and reliability of the film can be improved. It can also be inferred that, by forming on the seed layer a piezoelectric thin film in which the Pb molar ratio is 105% or more, and in which film stress is 50 MPa or more and 250 MPa or less, a piezoelectric thin film in which asymmetry of P-E hysteresis is reliably alleviated, and in which the piezoelectric property and the reliability are high, can be obtained.

Also, Table 2 illustrates compositions of the piezoelectric thin films (PLZT or PNZT) in Examples 1 to 4.

TABLE 2

| | | La [mol %] | Nb [mol %] | Pb [mol %] | Zr [mol %] | Ti [mol %] |
|---|---|---|---|---|---|---|
| TARGET VALUE | PLZT | 6 TO 10 | — | 105 OR MORE | 54 TO 59 | 41 TO 46 |
| | PNZT | — | 10 TO 20 | 105 OR MORE | 52 TO 59 | 41 TO 48 |
| EXAMPLE 1 (PLZT) | | 6.2 | — | 105 | 54.1 | 45.9 |
| EXAMPLE 2 (PLZT) | | 7.9 | — | 109 | 58.9 | 41.1 |
| EXAMPLE 3 (PNZT) | | — | 10.1 | 108 | 52.5 | 47.5 |
| EXAMPLE 4 (PNZT) | | — | 19.9 | 114 | 58.9 | 41.1 |

It can be inferred from Table 2 that, as for the PLZT film, in a case in which the molar composition ratios of the respective elements in the film are La: 6% or more and 10% or less and Zr: 54% or more and 59% or less, a high piezoelectric property can be obtained, and, as for the PNZT film, in a case in which the molar composition ratios of the respective elements in the film are Nb: 10% or more and 20% or less and Zr: 52% or more and 59% or less, a high piezoelectric property can be obtained.

[Others]

Although, in the above examples, the seed layer is formed, and the piezoelectric thin film in which the piezoelectric property and the reliability are high is formed on the seed layer, formation of the seed layer is not essential. Even without the seed layer, by appropriately controlling the film forming conditions such as the film forming ratio, the piezoelectric thin film in which the piezoelectric property and the reliability are high can be obtained.

Although, in the above examples, the sputtering is used to form the piezoelectric thin film, the film forming method is not limited to the sputtering. The piezoelectric thin film may be formed by means of a physical film forming method such as a pulse laser deposition (PLD) method and an ion plating method, a liquid phase growth method such as a sol-gel method, a chemical film forming method such as a metal organic chemical vapor deposition (MOCVD) method, or the like as long as the piezoelectric thin film illustrated in the above examples can be formed in the method. However, the sputtering is advantageous in that a piezoelectric film can be formed at a relatively lower substrate temperature than that in the sol-gel method, which is normally used as a method for forming a piezoelectric film, to provide more options for the substrate material. The sputtering is also advantageous in that, since the sputtering is a non-equilibrium process in which it is relatively easier than in other film forming methods to form a thick film of 3 μm or more, an additive element such as La and Nb is easily added to the crystal.

[Supplement]

The piezoelectric thin film, the piezoelectric actuator, the inkjet head, the inkjet printer, and the method for manufacturing the piezoelectric actuator according to the present embodiment described above can also be expressed as follows, and the following effects are thus exerted.

A piezoelectric thin film according to the present embodiment is a piezoelectric thin film obtained by adding a donor element to lead zirconate titanate. A molar ratio of lead to a total sum of zirconium and titanium is 105% or higher, and when positive and negative coercive electric fields in polarization and electric field hysteresis are referred to as Ec (+) and Ec (−), respectively, a value of |Ec (+) |/|Ec (−) | is 0.5 or more and 1.5 or less.

In the piezoelectric thin film obtained by adding the donor element to the PZT, since the value of |Ec (+) |/|Ec (−) | is 0.5 or more and 1.5 or less, asymmetry of the P-E hysteresis caused by addition of the donor element is alleviated. Accordingly, the piezoelectric thin film enabling driving with positive bias and having a high piezoelectric property can be achieved. Also, with the positive bias driving, diffusion of oxygen vacancies in the film can be restricted. Accordingly, breakdown and a decrease in displacement can be restricted, and reliability of the film can be improved. Further, since the molar ratio of Pb to the total sum of Zr and Ti is 105% or higher, and the excessive amount of Pb is sufficiently secured, the piezoelectric thin film in which the oxygen vacancies are reduced and in which the crystallinity is excellent even at a first stage of film formation can be achieved. Accordingly, a temporal change of the piezoelectric property caused by movement of the oxygen vacancies resulting from application of heat or an electric field can be restricted, and exfoliation of the piezoelectric thin film can be reduced. In this respect, the reliability of the film can be improved.

In the aforementioned piezoelectric thin film, internal stress of the film is desirably 50 MPa or more and 250 MPa or less. Since the internal stress of the film is 50 MPa or more, a dense film in which connecting strength at a grain boundary between crystals is improved can be formed. Thus, it is possible to restrict the oxygen vacancies and the excessive positive ions (for example, lead ions) from being distributed at the crystal grain boundary, and the asymmetry of the P-E hysteresis can reliably be alleviated. Also, since the internal stress of the film is 250 MPa or less, a crack and exfoliation of the film are prevented from being generated, and the reliability of the film can reliably be improved.

In the aforementioned piezoelectric thin film, breaking stress of the film is desirably 400 MPa or more. In this case, durability of the film is reliably improved, and the reliability of the film can further be improved.

In the aforementioned piezoelectric thin film, the donor element may be lanthanum, a molar ratio of the lanthanum to the total sum of the zirconium and the titanium may be 6% or more and 10% or less, and a molar ratio of the zirconium to the total sum of the zirconium and the titanium may be 54% or more and 59% or less. In La-added PZT (or PLZT), by setting the La ratio and the Zr ratio in the above ranges, the piezoelectric thin film enabling the asymmetry of the P-E hysteresis to be alleviated and having the ratio of the coercive electric fields fall within the aforementioned range can reliably be achieved.

In the aforementioned piezoelectric thin film, the donor element may be niobium, a molar ratio of the niobium to the total sum of the zirconium and the titanium may be 10% or more and 20% or less, and a molar ratio of the zirconium to the total sum of the zirconium and the titanium may be 52% or more and 59% or less. In Nb-added PZT (or PNZT), by setting the Nb ratio and the Zr ratio in the above ranges, the piezoelectric thin film enabling the asymmetry of the P-E hysteresis to be alleviated and having the ratio of the coercive electric fields fall within the aforementioned range can reliably be achieved.

A piezoelectric actuator according to the present embodiment includes the aforementioned piezoelectric thin film and a substrate adapted to support the piezoelectric thin film. With the aforementioned piezoelectric thin film, since a temporal change of the piezoelectric property, breakdown, and film exfoliation can be reduced, the highly-reliable piezoelectric actuator can be achieved.

In the aforementioned piezoelectric actuator, between the substrate and the piezoelectric thin film, a seed layer adapted to control crystalline orientation of the piezoelectric thin film is desirably formed. In this configuration, on the seed layer, the piezoelectric thin film having the same crystal structure as that of the seed layer is formed, and a high piezoelectric property can easily be achieved. Accordingly, the piezoelectric thin film with a high piezoelectric property and high reliability can easily be achieved.

The seed layer is desirably made of lead lanthanum titanate. In a case in which the PZT to which the donor element has been added is formed on the PLT, both the PZT and the PLT contain lead, and a composition difference is thus difficult to occur. Thus, the piezoelectric thin film having a composition enabling the asymmetry of the P-E hysteresis to be alleviated can reliably be formed.

The aforementioned piezoelectric actuator desirably further includes a pair of electrodes adapted to apply voltage to the piezoelectric thin film. Accordingly, with one electrode set at a ground potential, positive bias is applied to the other electrode to enable the piezoelectric actuator to be driven.

A method for manufacturing a piezoelectric actuator according to the present embodiment is a method for manufacturing the piezoelectric actuator configured as above, and the piezoelectric thin film is formed on the seed layer at a film forming rate of 2.5 μm/h or less. By forming the piezoelectric thin film on the seed layer under such film forming conditions, the internal stress of the piezoelectric thin film can be controlled within the aforementioned appropriate range. As a result, the aforementioned piezoelectric thin film can reliably be formed.

An inkjet head according to the present embodiment includes the aforementioned piezoelectric actuator and a nozzle substrate including a nozzle hole through which ink contained in an opening portion formed in the substrate of the piezoelectric actuator is ejected outward. Since the inkjet head includes the aforementioned piezoelectric actuator, the highly-reliable inkjet head can be achieved.

An inkjet printer according to the present embodiment includes the aforementioned inkjet head, and ink is ejected from the inkjet head toward a recording medium. Since the inkjet printer includes the aforementioned inkjet head, the highly-reliable inkjet printer can be achieved.

INDUSTRIAL APPLICABILITY

A piezoelectric thin film according to the present invention can be used in a piezoelectric actuator, an inkjet head, and an inkjet printer.

REFERENCE SIGNS LIST 1 inkjet printer
21 inkjet head
21a piezoelectric actuator
22 substrate
22a pressure chamber (opening portion)
24 lower electrode
25 piezoelectric thin film
26 upper electrode
29 seed layer
31 nozzle substrate
31a ejection hole (nozzle hole)

The invention claimed is:

1. A piezoelectric thin film obtained by adding a donor element to lead zirconate titanate, wherein a molar ratio of lead to a total sum of zirconium and titanium is 105% or higher, and
wherein, when positive and negative coercive electric fields in polarization and electric field hysteresis are referred to as Ec (+) and Ec (−), respectively, a value of |Ec (+) |/|Ec (−) | is 0.5 or more and 1.5 or less;
wherein the donor element is lanthanum,
wherein a molar ratio of the lanthanum to the total sum of the zirconium and the titanium is 6% or more and 10% or less, and wherein a molar ratio of the zirconium to the total sum of the zirconium and the titanium is 54% or more and 59% or less.

2. The piezoelectric thin film according to claim 1, wherein internal stress of the film is 50 MPa or more and 250 MPa or less.

3. The piezoelectric thin film according to claim 1, wherein breaking stress of the film is 400 MPa or more.

4. The piezoelectric thin film according to claim 1, wherein the donor element is niobium,
wherein a molar ratio of the niobium to the total sum of the zirconium and the titanium is 10% or more and 20% or less, and
wherein a molar ratio of the zirconium to the total sum of the zirconium and the titanium is 52% or more and 59% or less.

5. A piezoelectric actuator comprising:
the piezoelectric thin film according to claim 1; and
a substrate adapted to support the piezoelectric thin film.

6. The piezoelectric actuator according to claim 5, wherein, between the substrate and the piezoelectric thin film, a seed layer adapted to control crystalline orientation of the piezoelectric thin film is formed.

7. The piezoelectric actuator according to claim 6, wherein the seed layer is made of lead lanthanum titanate.

8. The piezoelectric actuator according to claim 5, further comprising:
a pair of electrodes adapted to apply voltage to the piezoelectric thin film.

9. A method for manufacturing the piezoelectric actuator according to claim 6, comprising:
forming the piezoelectric thin film on the seed layer at a film forming rate of 2.5 μm/h or less.

10. An inkjet head comprising:
the piezoelectric actuator according to claim 5; and
a nozzle substrate including a nozzle hole through which ink contained in an opening portion formed in the substrate of the piezoelectric actuator is ejected outward.

11. An inkjet printer comprising:
the inkjet head according to claim 10,
wherein ink is ejected from the inkjet head toward a recording medium.

12. The piezoelectric thin film according to claim 1, wherein the donor element is lanthanum.

13. A method for manufacturing the piezoelectric actuator according to claim 5, comprising:
forming the piezoelectric thin film at a film forming rate of 2.5 μm/h or less.

14. The piezoelectric thin film according to claim 2, wherein breaking stress of the film is 400 MPa or more.

15. The piezoelectric thin film according to claim 2, wherein the donor element is lanthanum,
wherein a molar ratio of the lanthanum to the total sum of the zirconium and the titanium is 6% or more and 10% or less, and
wherein a molar ratio of the zirconium to the total sum of the zirconium and the titanium is 54% or more and 59% or less.

16. The piezoelectric thin film according to claim 2, wherein the donor element is niobium,
wherein a molar ratio of the niobium to the total sum of the zirconium and the titanium is 10% or more and 20% or less, and
wherein a molar ratio of the zirconium to the total sum of the zirconium and the titanium is 52% or more and 59% or less.

17. A piezoelectric actuator comprising:
the piezoelectric thin film according to claim 2; and
a substrate adapted to support the piezoelectric thin film.

18. The piezoelectric thin film according to claim 3, wherein the donor element is lanthanum,
wherein a molar ratio of the lanthanum to the total sum of the zirconium and the titanium is 6% or more and 10% or less, and
wherein a molar ratio of the zirconium to the total sum of the zirconium and the titanium is 54% or more and 59% or less.

19. The piezoelectric thin film according to claim 3, wherein the donor element is niobium,
wherein a molar ratio of the niobium to the total sum of the zirconium and the titanium is 10% or more and 20% or less, and
wherein a molar ratio of the zirconium to the total sum of the zirconium and the titanium is 52% or more and 59% or less.

* * * * *